US006849957B2

(12) United States Patent
Takeuchi et al.

(10) Patent No.: US 6,849,957 B2
(45) Date of Patent: Feb. 1, 2005

(54) PHOTOMASK INCLUDING AUXILIARY MARK AREA, SEMICONDUCTOR DEVICE AND MANUFACTURING METHOD THEREOF

(75) Inventors: Masahiko Takeuchi, Hyogo (JP); Koichiro Narimatsu, Hyogo (JP); Atsushi Ueno, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 476 days.

(21) Appl. No.: 09/725,853

(22) Filed: Nov. 30, 2000

(65) Prior Publication Data

US 2001/0048145 A1 Dec. 6, 2001

(30) Foreign Application Priority Data

May 30, 2000 (JP) ........................................ 2000-160017

(51) Int. Cl.[7] .............................................. H01L 23/544
(52) U.S. Cl. ......................... 257/797; 257/620; 257/758
(58) Field of Search ................................. 257/797, 620, 257/758, 700; 438/401, 462, 975

(56) References Cited

U.S. PATENT DOCUMENTS 5,750,433 A    5/1998   Jo

| 5,786,260 A | * | 7/1998 | Jang et al. ................. 438/401 |
| 6,373,548 B1 | * | 4/2002 | Kim .......................... 349/158 |

FOREIGN PATENT DOCUMENTS

| JP | 58-70528    | 4/1983  |
| JP | 60-15944    | 1/1985  |
| JP | 60-211941   | 10/1985 |
| JP | 63-250148   | 10/1988 |
| JP | 63-262835   | 10/1988 |
| JP | 9-260446    | 10/1997 |
| JP | 10-22376    | 1/1998  |

* cited by examiner

Primary Examiner—Nathan J. Flynn
Assistant Examiner—Leonardo Andújar
(74) Attorney, Agent, or Firm—McDermott Will & Emery LLP

(57) ABSTRACT

A semiconductor device enabling precise and accurate measurement of an inspection mark in a simple manner is obtained. The semiconductor device includes a device forming area and a dicing line area arranged to surround the device forming area on a semiconductor substrate. In the dicing line area, first and second registration marks formed in different shots are provided, and the first and second registration marks include auxiliary marks for identifying the first and second registration marks.

4 Claims, 27 Drawing Sheets

US 6,849,957 B2

PHOTOMASK INCLUDING AUXILIARY MARK AREA, SEMICONDUCTOR DEVICE AND MANUFACTURING METHOD THEREOF

BACKGROUND OF THE INVENTION

1. Field of the Invention

The present invention relates to a semiconductor device, a photomask and a manufacturing method of a semiconductor device. More specifically, the present invention relates to a semiconductor device, a photomask and a manufacturing method of a semiconductor device enabling easier measurement of a registration mark and the like in the manufacturing steps.

2. Description of the Background Art

Conventionally, various process steps including film formation and photolithography have been taken in manufacturing a semiconductor device. In the step of exposure during photolithography, a mask pattern formed on a photomask is projected on a photoresist film or the like on a semiconductor substrate, using an exposure apparatus that is called a stepper. As a method used in the step of exposure, the step-and-repeat method has been known, in which the semiconductor substrate is fixed on a two-dimensionally movable X-Y stage, and the step of exposure is conducted every time the semiconductor substrate is moved by a prescribed distance.

FIG. 37 is a schematic plan view showing a conventional photomask used in the above described step of exposure. The photomask will be described with reference to FIG. 37.

Referring to FIG. 37, a photomask 120 has a transfer pattern formed using a metal film or the like which intercepts exposure light beam, on a substrate which transmits the exposure light beam. Photomask 120 shown in FIG. 37 includes a chip area 111 in which a transfer pattern of a semiconductor element, for example, is formed, and dicing areas 153, 154, 161 to 163 arranged surrounding the chip area 111 for forming a dicing line area. Mask patterns 121 to 127 for forming inspection marks are formed in dicing areas 153, 154, 161.

In photomask 120 shown in FIG. 37, it is necessary to make as small as possible the width of dicing areas 153, 154 and 161 to 163, and to arrange mask patterns 121 to 124 to form inspection mark areas 129a to 132a (see FIG. 38) such as the registration marks, at least at four corners of photomask 120. For this purpose, a so called projected and recessed dicing structure is employed. More specifically, a light shielding member 110 such as a chromium film is arranged at a prescribed area, so that a first outer peripheral dicing area 153 allowing passage of exposure light comes to have a projected portion 155 having relatively wide width and recessed portions 156 and 157 having relatively narrow widths. In the second outer peripheral dicing area 154, a light shielding member 110 is so arranged as to form a recessed portion 158 and projected portions 159 and 160, which fit the projected portion 155 and recessed portions 156 and 157 of the first outer peripheral dicing area 153. When circuit patterns are transferred on the semiconductor substrate by the step-and-repeat method using such a photomask 120, the structure shown in FIG. 38 results.

FIG. 38 is a schematic view of the structure obtained when the transfer patterns are transferred to the main surface of the semiconductor substrate using photomask 120 shown in FIG. 37. The chip area 128a and inspection mark areas 129a to 135a are simultaneously transferred by one step of exposure (one shot). The chip area 128b and inspection mark areas 129b and 132b are transferred by one shot, and the chip area 128c and inspection mark areas 130c and 131c are transferred by one shot, respectively.

In this manner, when photomask 120 shown in FIG. 37 is used, it is possible to set the width of dicing line area 113 to be approximately the same as the width of inspection mark areas 129a to 135a, 129b, 130c, 131c and 132b, and it is also possible to arrange inspection marks 129a to 132a at four corners of the area transferred by one step of exposure.

FIG. 39 is a schematic plan view showing the conventional registration mark 115 formed in inspection mark areas 129a to 135a, 129b, 130c, 131c and 132b shown in FIG. 38. FIGS. 40 and 41 are schematic cross sections of FIG. 39 taken along the lines XL—XL and XLI—XLI, respectively. The registration mark 115 will be described with reference to FIGS. 39 to 41.

Referring to FIGS. 39 to 41, the registration mark 115 is used to confirm registration accuracy of patterns in the step of exposure between a layer including trench isolation insulating films 101 and 101b as the lower layer to be registered and the layer including a first interconnection 103b as an upper layer to be registered. The trench isolation insulating film as the lower layer forms a first registration inspection pattern 101a. The first inspection pattern 101a has a rectangular planar shape. In an area positioned inside the first inspection pattern 101a, a second inspection pattern 103a having a rectangular planar shape is formed by the first interconnection as the upper layer to be registered. By measuring positional relation (such as the distance in horizontal direction) between the first and second inspection patterns 101a and 103a, it is possible to measure registration accuracy of the circuit pattern transferred in the step of exposure to form trench isolation insulating film 101 and the circuit pattern transferred in the step of exposure to form the first interconnection 103b.

In registration mark 115, a trench isolation pattern identification (ID) sign 116 identifying the step of exposure to form the lower layer including trench isolation insulating film 101 is formed by trench isolation insulating film 101b. Further, a first interconnection pattern identification (ID) sign 117 for identifying the step of exposure to form the upper layer including the first interconnection 103b is formed by the first interconnection 103b. As the trench isolation pattern ID sign 116 and the first interconnection pattern ID sign 117 are formed in this manner, which is the upper layer and which is the lower layer of which registration accuracy is to be detected can be readily determined by the registration mark 115.

FIG. 42 is a schematic plan view showing another example of the conventional registration mark 115. FIG. 43 is a schematic cross section of FIG. 42 taken along the line XLIII—XLIII, and FIG. 44 is a schematic cross section of FIG. 42 taken along the line XLIV—XLIV.

Referring to FIGS. 42 to 44, registration mark 115 basically has the same structure as the registration mark shown in FIGS. 39 to 41. It is noted, however, that in the registration mark 115 shown in FIGS. 42 to 44, the lower layer of which registration accuracy is to be detected is a layer including the first interconnection 103b formed on the main surface of a semiconductor substrate 119, and the upper layer is the layer including a second interconnection 105b formed on a first interlayer insulating film 108. Therefore, the first inspection pattern 103a that has a relatively large rectangular shape is formed by the same layer as the first interconnection 103b, while the second inspection pattern 105a of a relatively small rectangular shape is formed by the same layer as the second interconnection 105b. In registration mark 115, the first interconnection pattern ID sign 117 identifying the step of exposure to form the layer including the first interconnection 103b as the lower layer is formed by the first interconnection 103b, and the second interconnection pattern ID sign 136 identifying the step of exposure for forming the layer including the second interconnection 105b as the upper layer is formed by the second interconnection 105b. By using such a registration mark 115, it is possible to readily measure the registration accuracy between the layer including the first interconnection 103b and the layer including the second interconnection 105b.

The registration mark 115 such as shown in FIGS. 39 to 44 is formed, for example, in inspection mark areas 129a to 133a, 130a, 131b, 130c and 131c of FIG. 38.

Using the registration mark 115 such as shown in FIGS. 39 to 44, at every step of exposure (one shot), an operation such as a measurement to confirm registration accuracy in that shot is carried out. At this time, when the steps of exposure is taken in order from chip areas 128c, 128a . . . using such a photomask 120 as shown in FIG. 37, it would be the case that the inspection mark area 129a in the shot to form chip area 128a is arranged next to the inspection mark area 130c in the shot to form chip area 128c, on one dicing line area 113, as shown in FIG. 45. Here, FIG. 45 is a schematic plan view of registration marks 115a–115c formed in inspection mark areas 129a and 130c of FIG. 38.

Referring to FIG. 45, in the dicing line area 113, inspection mark area 129a and inspection mark area 130c are arranged next to each other. In inspection mark area 129a, registration marks 115a and 115b to measure the registration accuracy in the step of exposure to form chip area 128a are arranged. In inspection mark area 130c, registration marks 115c and 115d to measure registration accuracy in the step of exposure to form chip area 128c are arranged.

Now, assume that the registration accuracy in the step of exposure to form chip area 128a is to be measured, for example. At this time, an operator specifies either one of registration marks 115a and 115b on the semiconductor substrate, and measures and takes data related to the registration accuracy using either one of registration marks 115a and 115b. When the registration marks 115c and 115d of the same shape are arranged next to each other on the same dicing line area 113 as shown in FIG. 45, it is possible that the operator erroneously measure the data related to registration marks 115c and 115d representing the registration accuracy in the step of exposure to form chip area 128c, instead of the registration marks 115a and 115b. In such a case, not the data of registration accuracy in the step of exposure to form chip area 128a but the data of registration accuracy in the step of exposure to form chip area 128c would be measured.

Therefore, when the data of registration accuracy in the step of exposure to form chip area 128a as an immediately preceding step of exposure is to be fed back to the step of exposure of the next shot area, for example, chip area 128b, erroneous data (data of registration accuracy of the step of exposure to form chip area 128c) would be fed back. Such a feed back of erroneous data deteriorates registration accuracy for the chip area 128b.

In inspection mark areas 134a and 135b of FIG. 38, a testing element such as a TEG (Test Element Group) or a side monitor is formed. In inspection mark areas 134a and 135b, sometimes an electrode pad is formed to measure electric characteristic of the testing element. FIG. 46 shows an example of such an electrode pad. FIG. 46 is a schematic plan view of a pad group formed in inspection mark areas 134a and 135b.

Referring to FIG. 46, in dicing line area 113, electrode pads 143 to measure electric characteristic of the testing element are formed in inspection mark areas 134a and 135a. Further, a pad 144 acting as an edge sensor is formed adjacent to electrode pad 143. Electrode pads 143 and pad 144 such as shown in FIG. 46 are formed in each of the inspection mark areas 134a and 135a shown in FIG. 38. Though electrode pads 143 formed in inspection mark areas 134a and 135a have similar appearances, types of testing elements to which the pads are connected differ dependent on the position. It is possible that types of testing elements differ in inspection mark areas 134a and 135a. In such a case, it is necessary to distinguish the electrode pad 143 formed in inspection mark area 134a from the electrode pad 143 formed in inspection mark area 135a.

Conventionally, however, a mark to identify the electrode pad 143 for each of inspection mark areas 134a and 135a has not been specifically formed, as shown in FIG. 46. Therefore, there has been a possibility of an accident when electric characteristic is to be measured by connecting a probe to electrode pad 143 in inspection mark area 134a, that the operator measures the electrode pad 143 in inspection mark area 135a erroneously, taking data different from the necessary data.

In inspection mark areas 129a to 135a shown in FIG. 38, sometimes an isolated hole pattern 150 (Kelvin pattern) such as shown in FIG. 47 is formed, so as to enable process management inside the chip area 128a with higher accuracy. An operation of measuring the length of the isolated hole pattern 150 for process management, for example, is carried out. FIG. 47 is a schematic plan view showing a conventional isolated hole pattern formed in the inspection mark area of the semiconductor device. FIG. 48 is a schematic cross section of FIG. 47 taken along the line XLVIII—XLVIII.

Referring to FIGS. 47 and 48, in the area of inspection mark area where the isolated hole pattern 150 is formed, there is an active region 102 on the main surface of semiconductor substrate 119. A trench isolation insulating film 101 is arranged surrounding the active region 102. On the main surface of semiconductor substrate 119, the first interlayer insulating film 108 is formed. The second interconnection 105 is formed on the first interlayer insulating film 108. Isolated hole pattern 150 is formed by partially removing the first interlayer insulating film 108. A conductive film 149 is filled in the isolated hole pattern 150. The conductive film 149 connects the active region 102 to the second interconnection 105.

On the second interconnection 105, a second interlayer insulating film 109 is formed. On the second interlayer insulating film 109, third interconnections 107a to 107d are formed. By partially removing the second interlayer insulating film 109, a second contact hole 106 is formed. A conductive film 146 is filled in the second contact hole 106. The conductive film 146 connects the second interconnection 105 to the third interconnection 107. By partially removing the first and second interlayer insulating films 108 and 109, a second contact hole 106 is formed at a region positioned below the third interconnection 107c. In the second contact hole 106, a conductor 149 is filled. Conductor 149 connects active region 102 to the third interconnection 107c.

When the length of such an isolated hole pattern 150 is to be measured, it is necessary for an operator to find the isolated hole pattern 150 on the semiconductor substrate. Actually, the size of the isolated hole pattern 150 is extremely small, and locating the isolated hole pattern 150 by the operator takes long time. Such an operation has been one of the causes of lower productivity in the steps of manufacturing the semiconductor device.

In inspection mark areas 129a to 135a shown in FIG. 38, in order to perform process management in chip area 128a with higher accuracy, a field effect transistor such as shown in FIG. 49, for example, may be formed as a testing element, and an operation of measuring the gate length, for example, may be performed. FIG. 49 is a schematic plan view showing the testing element formed in the inspection mark area of the conventional semiconductor device. FIG. 50 is a schematic cross section of FIG. 49 taken along the line L—L.

Referring to FIGS. 49 and 50, in the inspection mark area, active regions 102 which will be the source and drain regions are formed in the main surface of semiconductor substrate 119. The active region 102 is surrounded by a trench isolation insulating film 101. On the active region 102, a second interconnection 105 serving as a gate electrode is formed, with a gate insulating film (not shown) interposed. On the second interconnection 105, the first interlayer insulating film 108 is formed. At a region positioned above a prescribed region of active region 102, a second contact hole 106 is formed by partially removing the first interlayer insulating film 108. A conductive film 146 is filled in the second contact hole 106. Third interconnections 107b and 107c are formed to be connected to the conductive film 146, on the first interlayer insulating film 108. As can be seen from FIG. 49, the second interconnection 105 is electrically connected to the third interconnection 107a formed on the first interlayer insulating film 108, through the conductive film formed in contact hole 106. The active regions 102 as the source and drain regions, the gate insulating film (not shown) and the second interconnection 105 as the gate electrode constitute the field effect transistor as the testing element.

In the field effect transistor formed in this manner, the width of the second interconnection 105 serving as the gate electrode, that is, gate length L has been measured by using a scanning electron microscope (SEM). When the gate length L is to be measured, it is preferred that the measured value is calibrated, to improve measurement accuracy. Conventionally, however, there has been no such structure as to enable calibration of the measurement value.

In the testing element such as the field effect transistor shown in FIGS. 49 and 50, if a sign enabling identification of a process condition used to form the testing element or the process condition itself is indicated near the testing element, it becomes possible for the operator to measure the size of the testing element and, at the same time, to confirm the process condition. Therefore, when there is a failure in the step of photolithography, it is possible to recognize the occurrence of the failure easily and immediately. Conventionally, however, a mark representing data of the process condition in the step of photolithography to form the testing element has not particularly been provided.

SUMMARY OF THE INVENTION

An object of the present invention is to provide a semiconductor device enabling precise and accurate measurement of an inspection mark easily.

Another object of the present invention is to provide a photomask to manufacture a semiconductor device enabling precise and accurate measurement of an inspection mark easily.

A still further object of the present invention is to provide a method of manufacturing a semiconductor device enabling precise and accurate measurement of an inspection mark easily.

The semiconductor device in accordance with a first aspect of the present invention includes an element forming area formed on a semiconductor substrate and a dicing line area arranged surrounding the element forming area, wherein first and second registration marks are formed in different shots, in the dicing line area. The first and second registration marks include auxiliary marks to identify the first and second registration marks.

Here, even when the first and second registration marks are formed next to each other in different shots, the first and second registration marks can readily be identified, by detecting the auxiliary mark. Therefore, the problem of mistaking the first and second registration marks in measuring the registration accuracy of the shots to form the first and second registration marks, respectively, can be prevented. As a result, registration accuracy can be measured accurately in a simple manner.

The semiconductor device in accordance with the above described aspect is manufactured by dividing a surface of a semiconductor substrate into a plurality of areas and performing photolithography for each area, wherein the area preferably has either the first or the second registration mark at an outermost peripheral portion. The auxiliary mark is preferably an in-area position indication mark indicating relative position in the area, for the first and second registration marks, respectively.

Here, when a plurality of registration marks are formed in an area to which a circuit pattern is transferred by one step of exposure, it is possible for the operator to readily recognize the relative positional relation of the registration marks to each other within the area, by the in-area position indication mark. This enables measurement of registration accuracy of the step of exposure with higher accuracy.

In the semiconductor device in accordance with the above described aspect, it is preferred that the first or the second registration mark is formed at least at any of four corners of the area.

In this case, the registration mark is arranged at an end of the area, and therefore, unsatisfactory alignment of the photomask in the step of exposure can more surely be detected.

In the semiconductor device in accordance with the aspect above, the first or the second registration mark may be formed at every one of the four corners of the area.

This enables more accurate measurement of registration accuracy.

In the semiconductor device in accordance with the above described aspect, the auxiliary mark may have an arrow-like planar shape.

By making the auxiliary mark to have an arrow-like planar shape, it becomes possible to indicate the relative position of the registration mark in the area. For example, when the planar shape of the auxiliary mark in the registration mark positioned at an upper right corner in the area is adapted to be an arrow indicating the upper right direction, the operator can intuitively recognize the position within the registration mark. This reduces the possibility of erroneous recognition by the operator of the registration mark.

The semiconductor device in accordance with another aspect of the present invention includes an element forming area formed on a semiconductor substrate and a dicing line area arranged surrounding the element forming area, and a testing element area is formed in the dicing line area. The testing element area includes at least one selected from the group consisting of an identification mark, a position indication mark, a pitch correcting mark and a condition indication mark. The identification (ID) mark identifies a type of the electrode included in the testing element area. The position indication mark indicates the position of a contact hole formed in an interlayer insulating film arranged in the testing element area. The pitch correcting mark is formed in the testing element area and consists of a plurality of line patterns arranged parallel to and spaced from each other. The condition indication mark is arranged in the testing element area, and indicates a process condition.

Accordingly, when the testing element area includes the ID mark, for example, it is possible to identify the type of the electrode easily by the ID mark. When the testing element area includes the position indication mark, it is possible for the operator to readily detect the position of the contact hole by the position indication mark. When the testing element area includes the pitch correcting mark, it is possible to quickly and readily calibrate data when gate length of the field effect transistor or the like for evaluation is to be measured, with reference to the pitch correcting mark. When the testing element area includes the condition indication mark, it is possible for the operator to readily know from the condition indication mark the process condition used when the element for measurement in the testing element area is formed. Therefore, failure of the process can immediately be detected when the inspection mark in the testing element region is measured, for example.

In the semiconductor device in accordance with the aspect above, the ID mark may be formed on an electrode.

In that case, it is unnecessary to secure an area to form the ID mark in the testing element area, and therefore the testing element area can be reduced.

In the semiconductor device in accordance with the aspect above, the planar shape of the ID mark may constitute a character, and width of a line as a part of the character is preferably at most 10 μm.

In this case, the line width of the character as the ID mark can be made sufficiently smaller than the size of the tip of the probe which is pressed against the electrode. Therefore, even when the character as the ID mark is formed on the electrode, it is possible to surely bring the probe to be in contact with the surface of the electrode.

In the semiconductor device in accordance with the aspect above, it is preferred that the width of the ID mark is at least 30 μm.

In this case, the ID mark can be made sufficiently larger than the width of a blade used for dicing, that is, used to cut chips from the semiconductor substrate. Therefore, in the dicing line area around the chip as a semiconductor device after dicing, the ID mark is left without fail. Therefore, in case a trouble such as peeling of a pattern occurs in the step of dicing, the position where such a trouble as pattern peeling occurred can easily be specified, using the position of the ID mark as an origin.

Further, such a large ID mark helps the operator find the ID mark easily, when the operator looks for an electrode. In other words, it improves visibility of the ID mark. This enables accurate and quick inspecting operation.

In the semiconductor device in accordance with the aspect above, the position indication mark may be an opening formed in the interlayer insulating film.

In that case, the position indication mark can be formed simultaneously in the step of forming the contact hole. Therefore, it is unnecessary to add a new process step to form the position indication mark. Therefore, the number of process steps of the semiconductor device is not increased to form the position indication mark.

In the semiconductor device in accordance with the aspect above, the planar shape of the opening may be an arrow indicating the direction of the contact hole.

In this case, it is possible for an operator to confirm the position of the contact hole easily, by identifying the planar shape of the opening as the position indication mark.

In the semiconductor device in accordance with the aspect above, it is preferred that the testing element area further includes a conductive film formed on the dicing line area. The pitch correcting mark is preferably positioned spaced at a position adjacent to the conductive film.

In that case, it is possible to calibrate the measurement data easily, using the pitch correcting mark, when the width of the conductive film is measured. As a result, accuracy in measuring the width of the conductive film can be improved.

In the semiconductor device in accordance with the aspect above, the pitch correcting mark may be formed of the same layer as the conductive film.

In the semiconductor device in accordance with the aspect above, the planar shape of the condition indication mark is preferably a character indicating a process condition.

In that case, it is possible for the operator to confirm the process condition easily, by identifying the condition indication mark.

In the semiconductor device in accordance with the aspect above, the process condition should preferably include at least two selected from the group consisting of a design dimension, an on-mask dimension, a resist target dimension and a finished target dimension.

In that case, it is possible for the operator to find a process failure or the like surely and immediately, based on the data. For example, where the design dimension and the on-mask dimension are indicated as the condition indication mark, it is possible for the operator to readily recognize whether the sizing is correct or not. Where the on-mask dimension and the resist target dimension are indicated as the condition indication mark, it is possible for the operator to readily detect a trouble in the photolithography process. Where the resist target dimension and the finished target dimension are indicated as the condition indication mark, it is possible for the operator to readily detect a failure in the etching process.

The photomask in accordance with a still another aspect of the present invention includes an element pattern forming area, that is provided with an area having rectangular planar shape, a first outer peripheral dicing area, a second outer peripheral dicing area and a registration mark area. The first outer peripheral dicing area is arranged in contact with one of a paired sides of a rectangular area, and has an outer peripheral shape having a wide projected portion and a narrow recessed portion. The second outer peripheral dicing area is arranged in contact with the other one of the paired sides, and has an outer peripheral shape having a projected portion and a recessed portion which fit the projected portion and a recessed portion of the first outer peripheral dicing area. The registration mark area is arranged in the projected portions of the first and second outer peripheral dicing areas corresponding to four corners of the rectangular area. The registration mark area includes an auxiliary mark area representing to which corner of the four corners it corresponds.

In this case, it is possible for the operator to readily identify, in an area to which a circuit pattern is transferred by using a photomask on a semiconductor substrate, at which relative position the registration mark formed by the registration mark area is positioned, by the auxiliary mark formed by the auxiliary mark area. As a result, the operation of measuring registration accuracy of the registration mark can be carried out surely and easily.

The method of manufacturing a semiconductor device in accordance with a still further aspect of the present invention utilizes the method of exposure using the photomask in accordance with the above described aspect.

Therefore, the operation of measuring registration accuracy for the registration mark, for example, can be carried out accurately, precisely and easily. Therefore, degradation in registration accuracy caused by erroneous measurement of the registration mark, for example, can be prevented. Thus, a semiconductor device having superior registration accuracy can be obtained easily.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
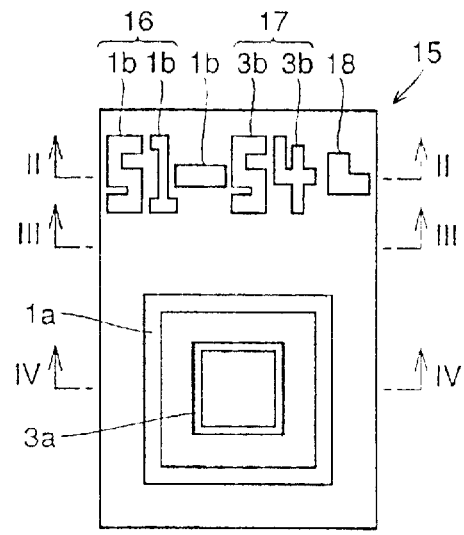
FIG. 1 is a schematic plan view of a registration mark formed in an inspection mark area in accordance with a first embodiment of the semiconductor device in accordance with the present invention.
Figure 2:
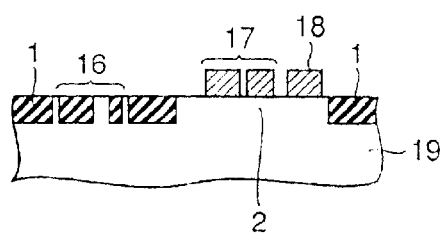
FIG. 2 is a schematic cross section taken along the line II—II of FIG. 1.
Figure 3:
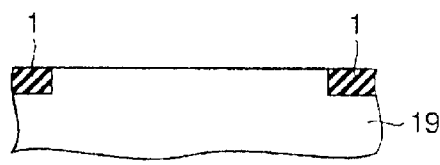
FIG. 3 is a schematic cross section taken along the line III—III of FIG. 1.
Figure 4:
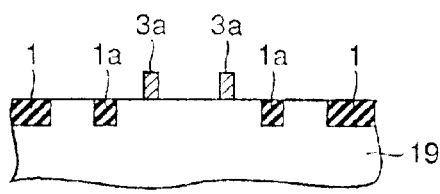
FIG. 4 is a schematic cross section taken along the line IV—IV of FIG. 1.

Embodiments of the present invention will be described with reference to the figures. In the figures, the same or corresponding portions will be denoted by the same reference characters and description thereof will not be repeated.

(First Embodiment)

Referring to FIGS. 1 to 4, a registration mark 5 is a mark used for measuring registration accuracy between a layer of a trench isolation insulating film 1 formed on a main surface of a semiconductor substrate 19 and a layer in which a first interconnection 3b is formed. Registration mark 15 includes a first inspection pattern 1a formed of the same layer as trench isolation insulating film 1b, and a second inspection pattern 3a formed of the same layer as the first interconnection 3b. The first inspection pattern 1a has a rectangular planar shape, as shown in FIG. 1. The second inspection pattern 3a is positioned inner than the first inspection pattern 1a, and has a rectangular planar shape relatively smaller than the first inspection pattern 1a.

In registration mark 15, a trench isolation pattern identification (ID) sign 16 as a process identification (ID) mark identifying the step of exposure to form trench isolation insulating film 1 is formed. Trench isolation pattern ID sign 16 is formed by the trench isolation insulating film 1b. A first interconnection pattern ID sign 17 identifying the step of exposure to form the layer including the first interconnection 3b is formed by the first interconnection 3b.

In registration mark 15, an in-shot position indication mark 18 as an auxiliary mark is formed by a conductive film of the same layer as the first interconnection 3b. The in-shot position indication mark 18 serves as an in-area position indication mark indicating, when a plurality of registration marks 15 are arranged in an area to which a circuit pattern is transferred by one step of exposure, at which relative position within the area the registration mark 15 is positioned.

Figure 5:
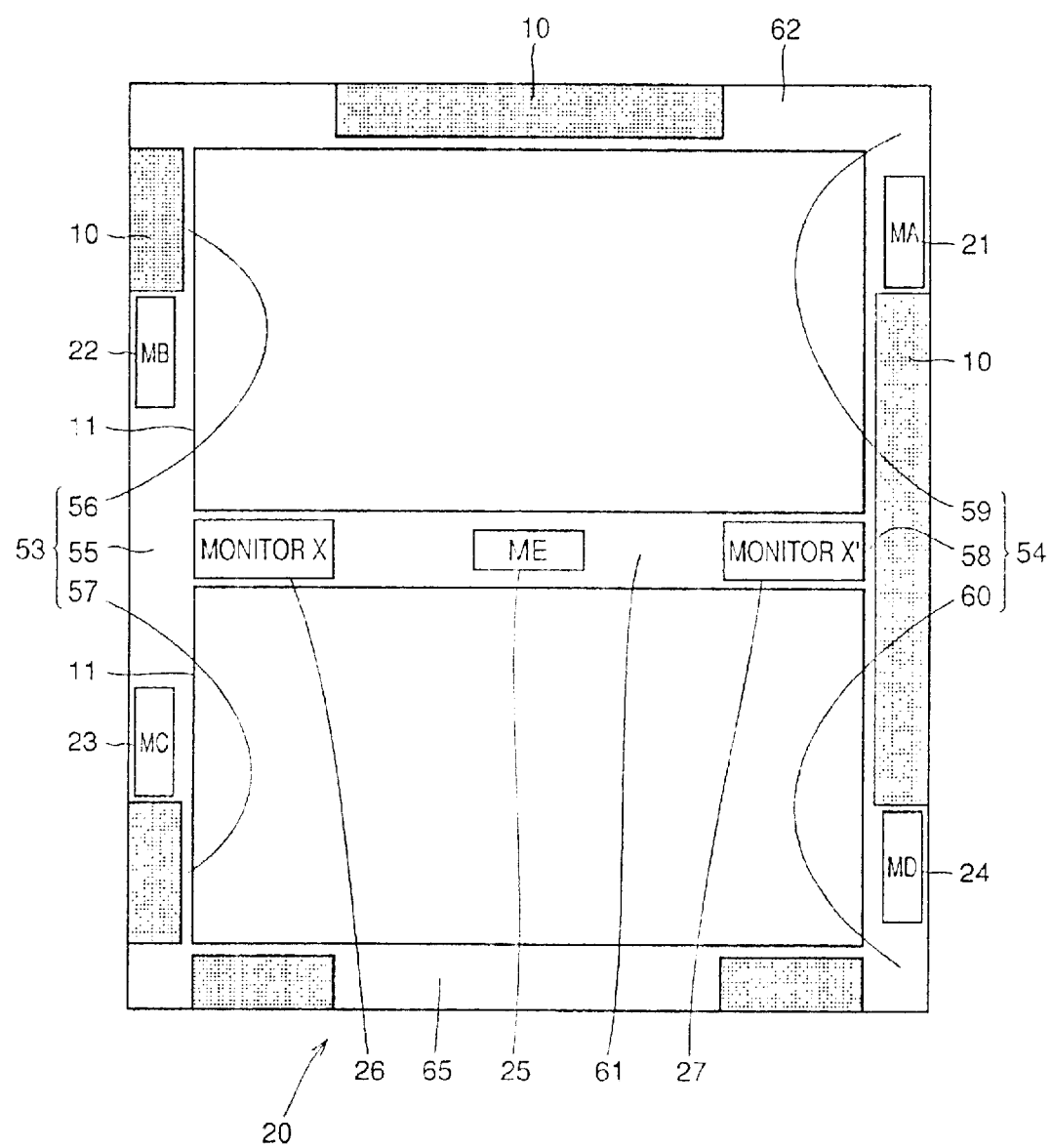
FIG. 5 is a schematic plan view of a photomask in accordance with the present invention, used in manufacturing the semiconductor device in accordance with the present invention.

Assume that a photomask 20 such as shown in FIG. 5 is used, in manufacturing a semiconductor device having a registration mark 15 such as shown in FIGS. 1 to 4. The photomask 20 shown in FIG. 5 is a reticle (a photomask used for a stepper or a photorepeater). Referring to FIG. 5, photomask 20 includes a mask pattern 11 of a chip area in which a transfer pattern to form devices such as a semiconductor memory device is formed, and dicing line areas 53, 54, 61, 62 and 65 for forming dicing line areas, arranged surrounding the mask pattern 11 in the chip area. In dicing areas 53, 54 and 61, mask pattern areas 21 to 27 for the inspection mark areas are formed in which registration mark 15 and testing elements are formed.

In photomask 20 shown in FIG. 5, it is necessary to make as small as possible the width of dicing areas 53, 54, 61, 62 and 65, and to arrange mask pattern areas 21 to 24 to form inspection mark areas 29a to 32a (see FIG. 6) in which registration marks and the like are arranged, at least at four corners of photomask 20. For this purpose, the so called projected and recessed dicing structure is employed. More specifically, in photomask 20, an area having a rectangular planar shape is formed by the mask pattern 11 of the chip area as the device pattern forming area and dicing area 61.

A first outer peripheral dicing line area 53 having such an outer peripheral shape that includes a wide projected portion 55 and narrow recessed portions 56 and 57, is arranged in contact with one of a paired sides of the rectangle of this area. The projected portion 55 and recessed portions 56 and 57 are formed by arranging a light shielding member 10 such as a chromium film at prescribed areas of photomask 20. A second outer peripheral dicing area 54 having such an outer peripheral shape that includes a recessed portion 58 and projected portions 59 and 60 that fit the projected portion 55 and recessed portions 56 and 57 of the first outer peripheral dicing area 53 is arranged in contact with the other one of the aforementioned paired sides of the area. More specifically, in the second outer peripheral dicing area 54, the light shielding member 10 is so arranged as to form the recessed portion 58 and projected portions 59 and 60 that fit the projected portion 55 and recessed portions 56 and 57 of the first outer peripheral dicing area 53. Similarly, in dicing areas 62 and 65, light shielding members 10 are so arranged as to form projected portions and recessed portions that fit each other.

Corresponding to the four corners of the rectangular area, mask pattern areas 21 to 24 (marks A to D: marks A to D correspond to MA, MB, MC, MD, in FIG. 5, respectively) as the registration mark areas for forming the registration marks 15 such as shown in FIGS. 1 to 4 are arranged in the projected portions 55, 59 and 60 of the first and second outer peripheral dicing areas 53 and 54. At the central portion of dicing line area 61, a mask pattern area 25 (mark E: mark E corresponds to ME in FIG. 5) of the inspection mark for forming registration mark 15 shown in FIG. 1 is arranged. In mask pattern areas 21 to 25 of the inspection marks, a mask pattern as the auxiliary mark area for forming the in-shot position indication mark 18 shown in FIG. 1 is formed. Further, in mask pattern areas 26 and 27 for the inspection mark, a mask pattern for forming a testing element is arranged, as will be described later.

Figure 6:
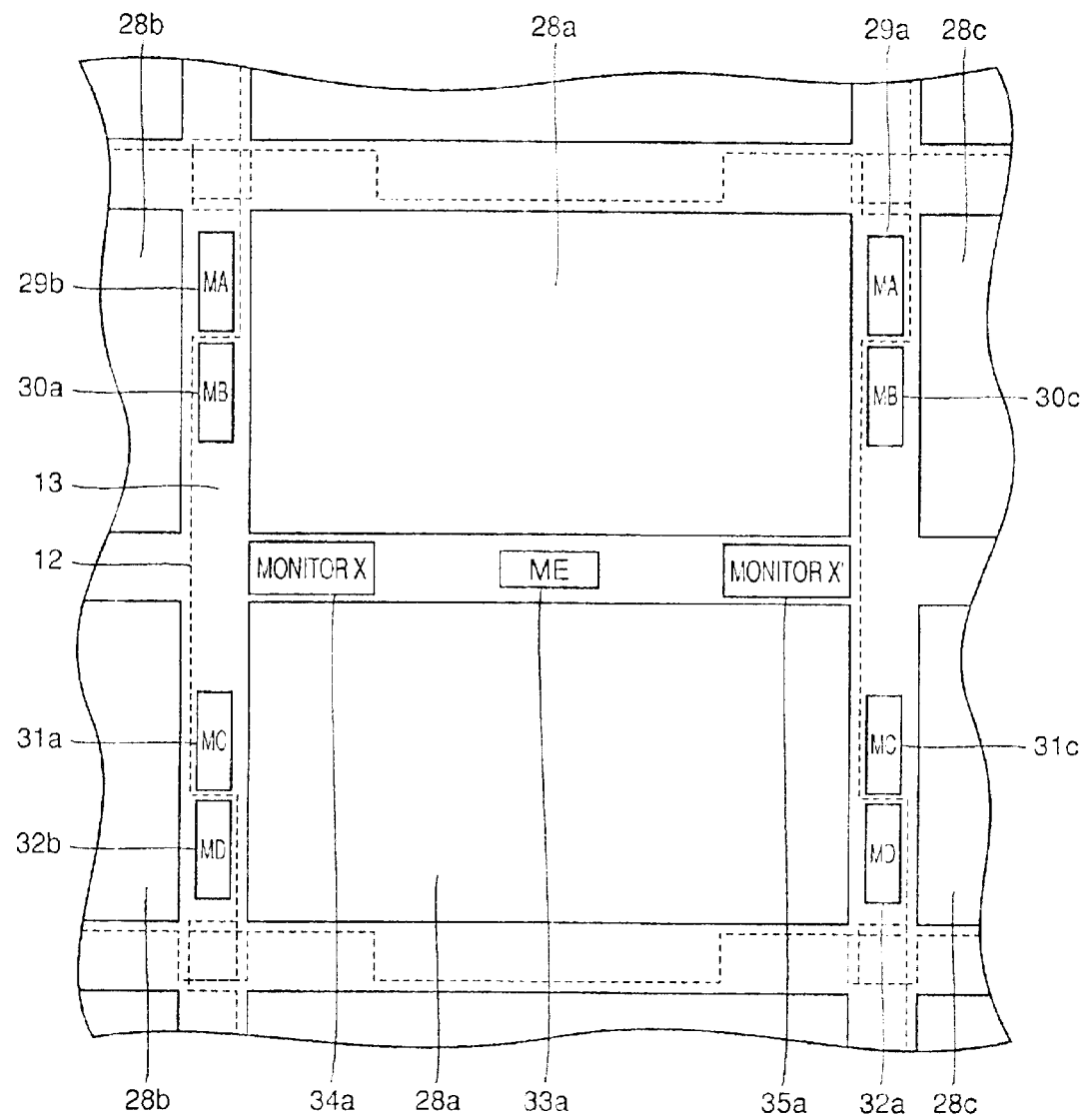
FIG. 6 is a schematic diagram representing a surface of a semiconductor substrate to which a circuit pattern is transferred by using the photomask shown in FIG. 5.

Using such a photomask 20 as shown in FIG. 5, a circuit pattern is transferred by the step-and-repeat method to the semiconductor substrate. FIG. 6 shows a surface of the semiconductor substrate as the semiconductor device to which the circuit pattern has been transferred using photomask 20 shown in FIG. 5.

Referring to FIG. 6, the area transferred by one step of exposure using photomask 20 shown in FIG. 5 includes a chip area 28a and inspection mark areas 29a to 35a. A boundary portion of the area exposed by one step of exposure (one shot) is represented by a dotted line, as a shot boundary 12. By repeating the step of exposure with the photomask 20 shifted by a prescribed distance, it is possible to form chip areas 28b and 28c at positions adjacent to chip area 28a, for example. In the step of exposure to form chip area 28b, a pattern for forming inspection mark areas 29b and 32b is transferred simultaneously. In the step of exposure to form chip area 28c, the pattern is transferred in the inspection mark areas 30c and 31c, simultaneously.

In this manner, by permitting the step of exposure using the photomask 20 shown in FIG. 5, it is possible to form inspection mark areas 29a to 32a including the registration mark 15 at four corners of the area to be exposed by one step of exposure (one shot). Therefore, misalignment of photomask 20 in the step of exposure can more surely be detected.

By such a step of exposure, the inspection mark area 29a including the registration mark for confirming registration accuracy of the shot for forming chip area 28a, and the inspection mark area 30c including the registration mark for confirming registration accuracy of the shot for forming chip area 28c come to be arranged next to each other in dicing line area 13, for example. At this time, in mask pattern areas 21 to 25 for the inspection mark in photomask 20, auxiliary mark areas for forming in-shot position indication marks 18a to 18e such as shown in FIG. 7 in respective registration marks are formed.

Figure 7:
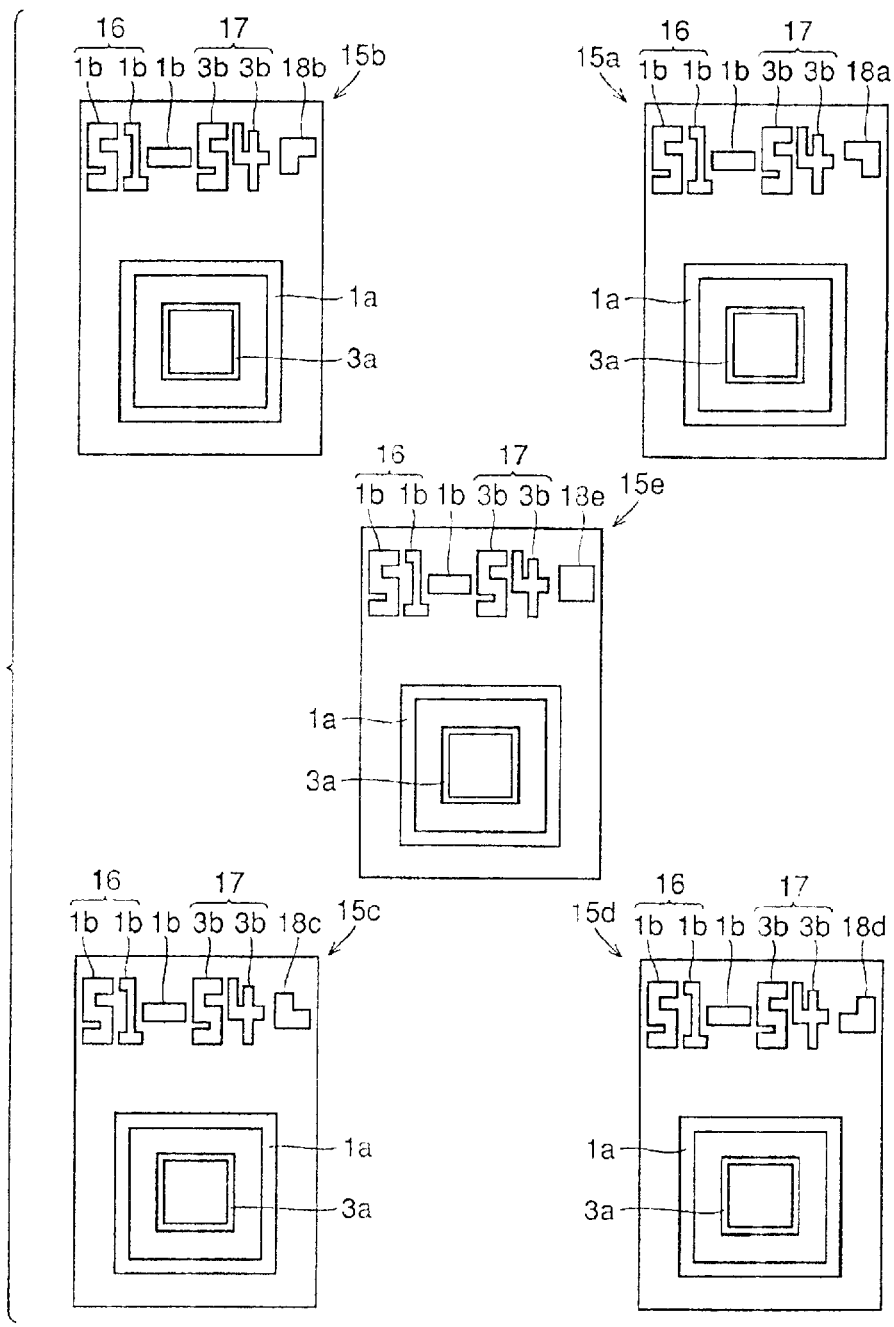
FIG. 7 is a schematic diagram representing the registration mark formed in inspection mark areas 29a to 33a of FIG. 6.

In inspection mark area 29a, registration mark 15a shown in FIG. 7 is formed. In registration mark 15a, an in-shot position indication mark 18a representing relative position of the registration mark 15a within the area to which the pattern is transferred by one step of exposure (area including chip area 28a) is formed. As registration mark 15a is formed in inspection mark area 29a, it is positioned at an upper right portion within the shot. Therefore, the in-shot position indication mark 18a has a rotated L-planar shape representing the upper right portion.

In inspection mark areas 30a to 32a, registration marks 15b to 15d are formed, respectively. In registration marks 15b to 15d, in-shot position indication marks 18b to 18d representing relative positions of respective registration marks 15b to 15d are formed. In inspection mark area 33a, registration mark 15e is formed. Registration mark 15e is positioned approximately at the center of the area to which the circuit pattern is transferred by one shot. Therefore, the in-shot position indication mark 18e has a rectangular planar shape, to indicate that the registration mark 15e is positioned approximately at the center of this area. Dependent on the width of dicing line area 13 or the arrangement of inspection mark areas 29a to 29d, a structure in which registration marks 15a to 15e are rotated by 90°, respectively, from FIG. 7 may be employed.

In order to form the registration marks 15a to 15e with the in-shot position indication marks 18a to 18e as auxiliary marks, respectively, photomask 20 shown in FIG. 5 has a transfer pattern of such a shape that corresponds to the registration marks 15a to 15e, in the mask pattern areas 21 to 25 for the inspection marks. When the chip areas 28a to 28c are formed by the step-and-repeat method using the photomask 20, registration marks similarly having the in-shot position indication marks are formed in inspection mark areas 29b, 32b, 30c and 31c. Consider that portion where inspection mark areas 29a and 30c are formed.

Figure 8:
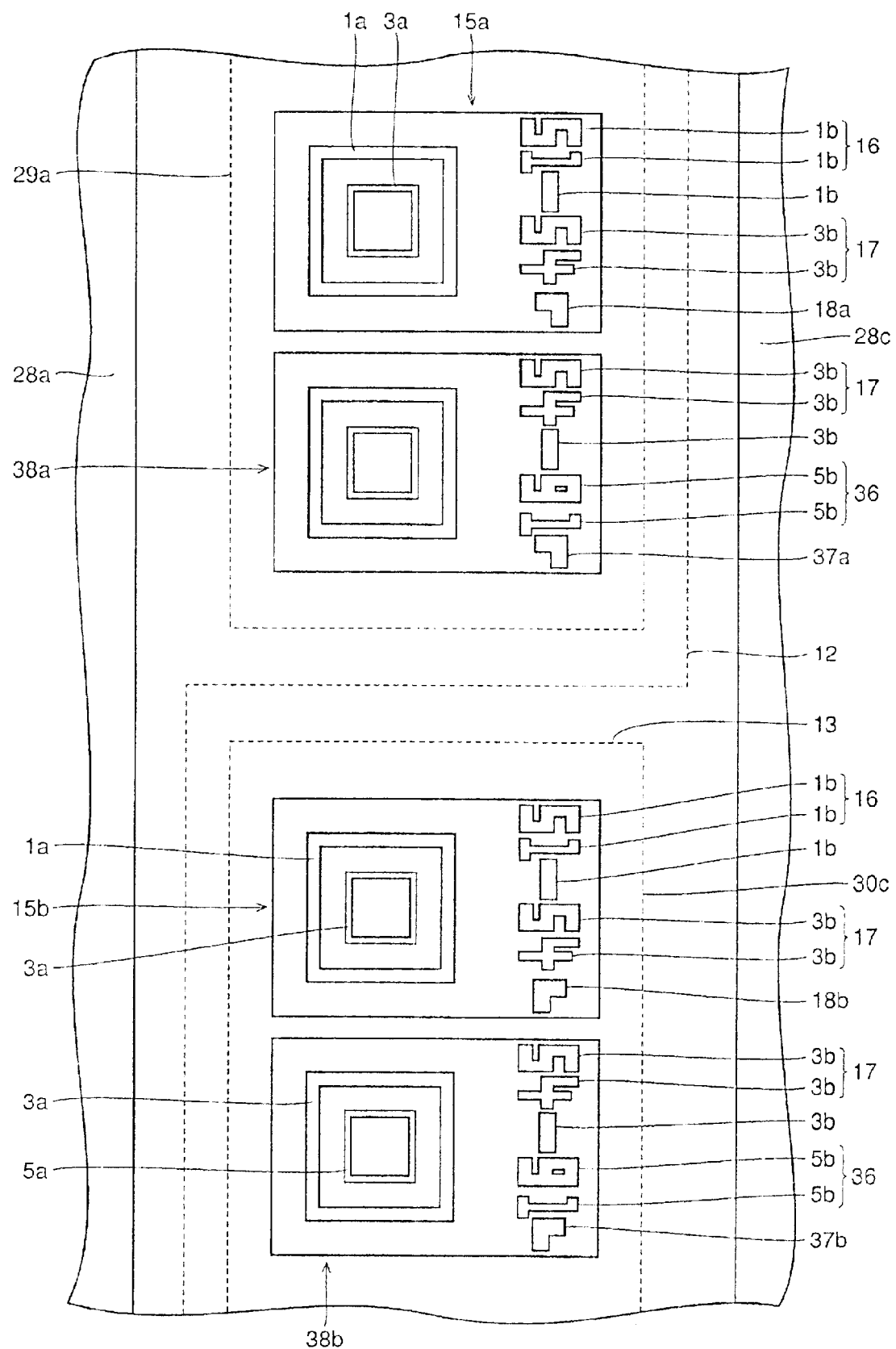
FIG. 8 is a partially enlarged schematic diagram of the area where inspection mark areas 29a and 30c are formed, of FIG. 6.

Referring to FIG. 8, in inspection mark area 29a, a registration mark 15a for confirming registration accuracy between the layer including trench isolation insulating film 1b and the layer including the first interconnection 3b, and a registration mark 38a for confirming registration accuracy between the layer including the first interconnection 3b and layer including the second interconnection 5b are formed. The registration marks 15a and 38a are used to measure the registration accuracy of the shot for forming chip area 28a (see FIG. 6).

In inspection mark area 30c adjacent to inspection mark area 29a, registration marks 15b and 38b basically of the same shape as registration marks 15a and 38a are formed. These registration marks 15b and 38b, however, are formed in the shot for forming chip area 28c, and used for measuring registration accuracy of the shot for forming chip area 28c.

Further, inspection mark area 30c is formed in mask pattern area 22 for the inspection mark of photomask 20. Therefore, in registration marks 15b and 38b, the in-shot position indication marks 18b and 37b are of different shapes from the in-shot position indication marks 18a and 37a of registration marks 15a and 38a. Therefore, it is possible for the operator to identify each of the registration marks 15a, 15b, 38a and 38b. Therefore, when the operator specifies any of registration marks 15a, 15b, 38a and 38b to measure the registration accuracy, an accident of mistaking the registration mark 15a for registration mark 15b, or mistaking registration mark 38a for registration mark 38b can be prevented. Further, because of the presence of in-shot position indication marks 18a, 18b, 37a and 37b, it is possible for the operator to readily determine to which shot the patterns of registration marks 16a, 15b, 38a and 38b belong. Therefore, the accident as described above can readily be prevented. Therefore, measurement of registration accuracy can be performed precisely in a simple manner. As a result, a semiconductor device having superior registration accuracy can be obtained through a simple method.

Further, as the in-shot position indication marks 18a to 18e are formed, it is possible for the operator, when a plurality of registration marks 15a to 15e are formed in the area to which the circuit pattern is transferred by one step of exposure, to readily recognize relative positional relation of respective registration marks 15a to 15e. This enables measurement of registration accuracy in the step of exposure with higher accuracy.

Figure 9:
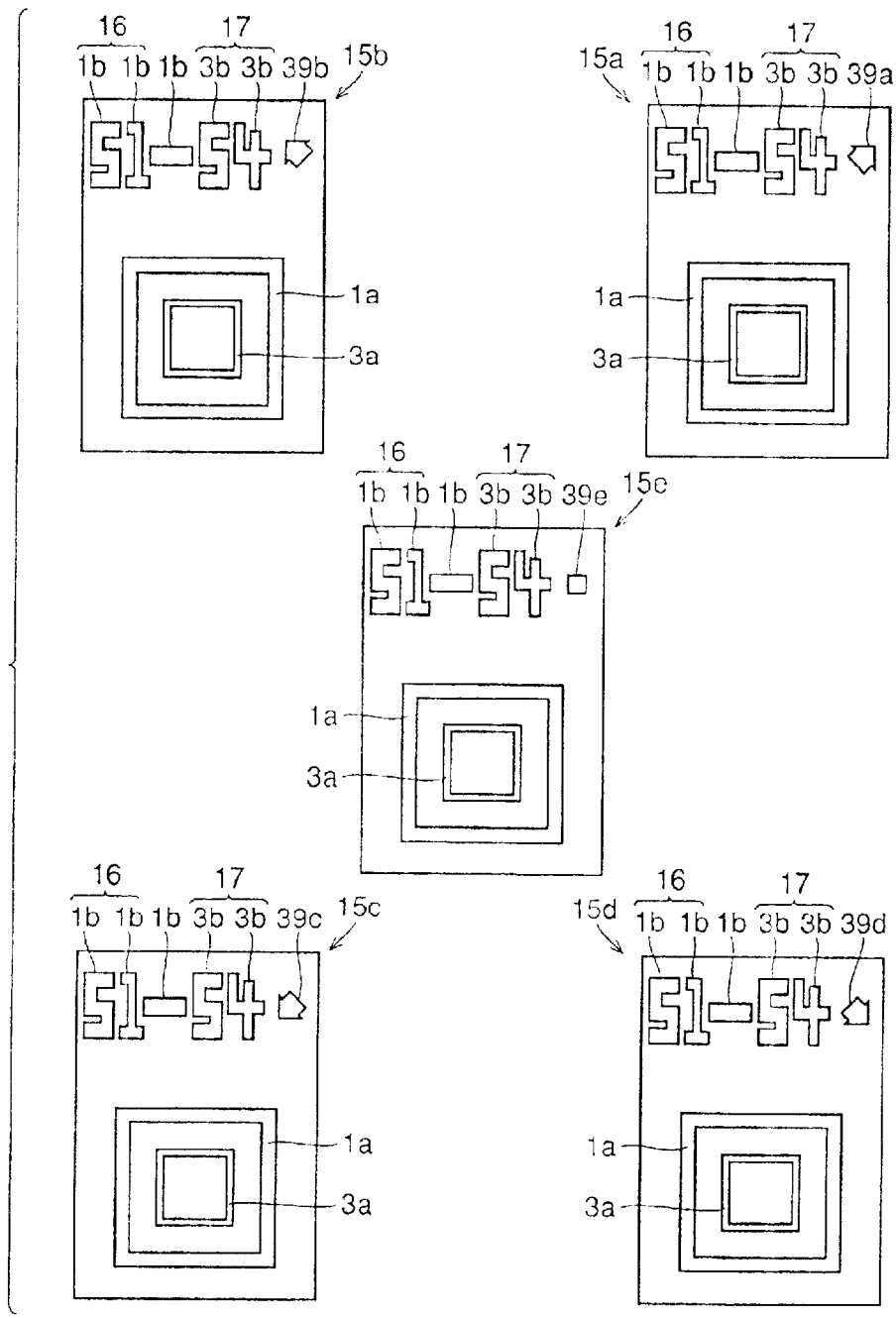
FIG. 9 is a schematic diagram representing the registration mark formed in a modification of the first embodiment of the semiconductor device in accordance with the present invention.

The registration marks 15a to 15e of the semiconductor device shown in FIG. 9 basically has the similar structure as the registration marks 15a to 15e of the semiconductor device shown in FIG. 7. The planar shape of in-shot position indication marks 39a to 39e, however, is different from that of the registration marks 18a to 18e shown in FIG. 7. FIG. 9 corresponds to FIG. 7. The planar shape of in-shot position indication marks 39a to 39e in registration marks 15a to 15e shown in FIG. 9 is like an arrow, so as to represent relative positions of respective registration marks. When the in-shot position indication marks 39a to 39d of the arrow shape are used, similar effects as attained in the semiconductor device shown in FIG. 7 can be attained and, in addition, the operator can recognize more intuitively the relative positions of registration marks 15a to 15d. Therefore, the positions of registration marks 15a to 15e can be determined easier. The in-shot position indication mark 39e in registration mark 15e has a rectangular shape similar to the in-shot position indication mark 18e shown in FIG. 7, as the registration mark is positioned at the center of the shot. In order to distinguish the mark from the in-shot position indication mark 18*e* of FIG. 7, the in-shot position indication mark 39*e* is made smaller in size than the in-shot position indication mark 18*e* (see FIG. 7).

(Second Embodiment)

Referring to FIGS. 10 to 13, registration mark 15 is for measuring registration accuracy between the layer including the first interconnection 3*b* and the layer including the second interconnection 5*b*. In registration mark 15, a first inspection pattern 3*a* having a rectangular planar shape is formed by the same layer as the first interconnection 3*b*. On the first inspection pattern 3*a* and the first interconnection 3*b*, the first interlayer insulating film 8 is formed. On the first interlayer insulating film 8, the second inspection pattern 5*a* having a rectangular planar shape and a second interconnection 5*b* are formed. The second inspection pattern 5*a* is formed by the same layer as the second interconnection 5*b*. By measuring the distance in horizontal direction between the first inspection pattern 3*a* and the second inspection pattern 5*a*, the registration accuracy can be measured.

In registration mark 15, a first interconnection pattern ID sign 17 identifying the step of exposure for forming the layer including the first interconnection 3*b* is formed by the first interconnection 3*b*. Further, a second interconnection pattern ID sign 36 for identifying the step of exposure for forming the layer including the second interconnections 5*a* and 5*b* is formed by the second interconnection 5*b*. Further, an in-shot position indication mark 37 of registration mark 15 is formed by the same layer as the second interconnection 5*b*.

Similar effects as attained by the semiconductor device in accordance with the first embodiment can be attained also by the semiconductor device having such a registration mark.

(Third Embodiment)

Figure 14:
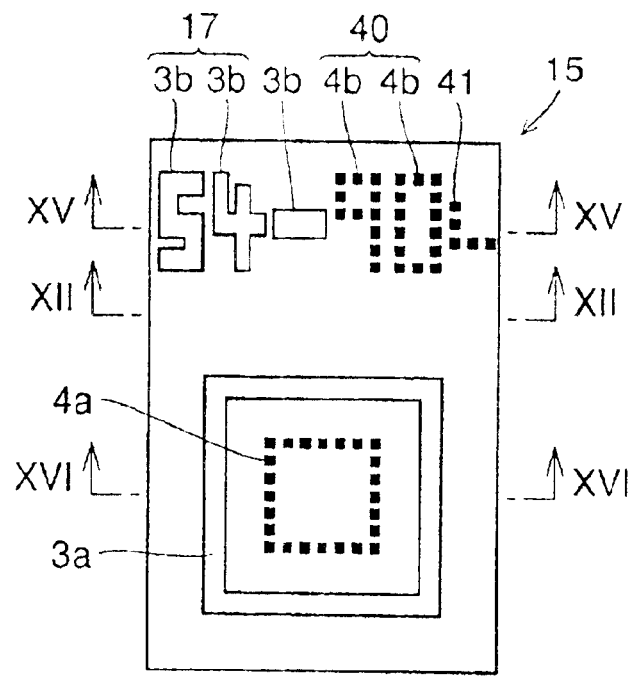
FIG. 14 is a schematic plan view showing a registration mark in accordance with a third embodiment of the semiconductor device in accordance with the present invention.
Figure 15:
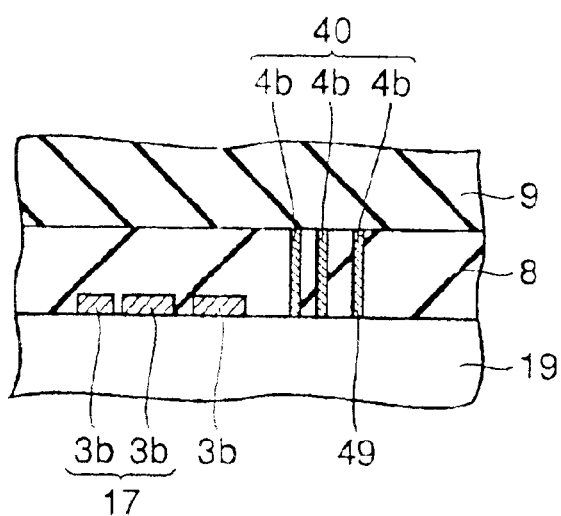
FIG. 15 is a schematic cross section taken along the line XV—XV of FIG. 14.
Figure 16:
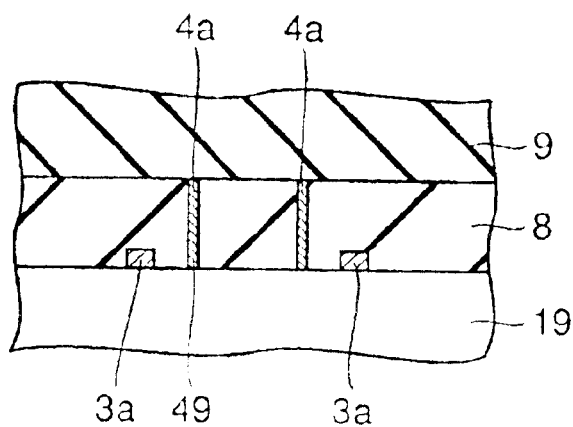
FIG. 16 is a schematic cross section taken along the line XVI—XVI of FIG. 14.

Referring to FIGS. 14 to 16, registration mark 15 is used for measuring registration accuracy between the layer including the first interconnection 3*b* and a contact hole formed by the same shot as a first contact hole 4*b* in the first interlayer insulating film 8. In registration mark 15, the first inspection pattern 3*a* having a rectangular planar shape is formed by the same layer as the first interconnection 3*b*. Further, the second inspection pattern 4*b* having a rectangular planar shape is formed by a contact hole formed in the same step as the contact hole 4*b* formed in the first interlayer insulating film 8. By measuring the distance in horizontal direction between the first and second inspection patterns 3*a* and 4*a*, it is possible to evaluate registration accuracy between the layer including the first interconnection 3*b* and a group of contact holes formed in the same step as contact hole 4*b*. Here, the schematic cross section taken along the line XII—XII of FIG. 14 is similar to the schematic cross section of FIG. 12.

Figure 10:
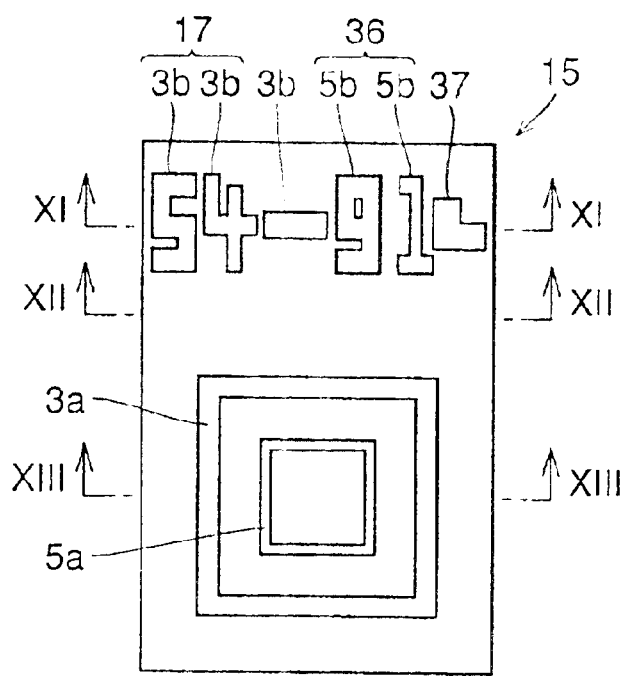
FIG. 10 is a schematic plan view representing a registration mark in accordance with a second embodiment of the semiconductor device in accordance with the present invention.
Figure 11:
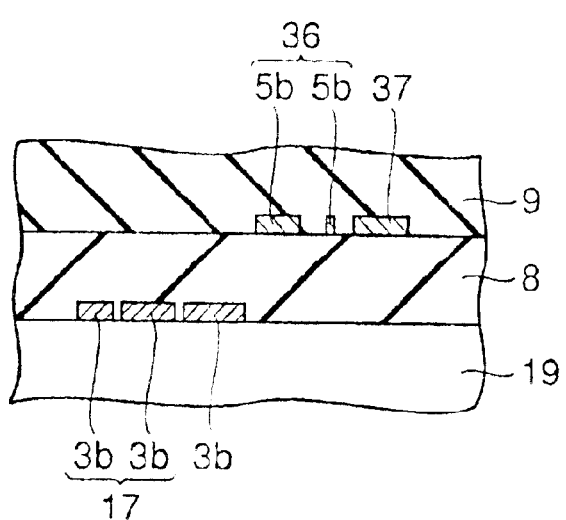
FIG. 11 is a schematic cross section taken along the line XI—XI of FIG. 10.
Figure 12:
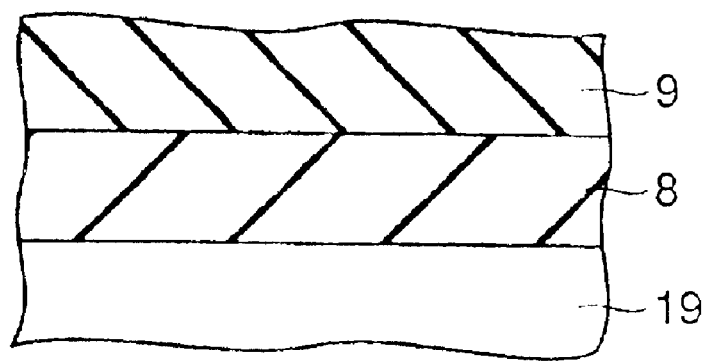
FIG. 12 is a schematic cross section taken along the line XII—XII of FIG. 10.
Figure 13:
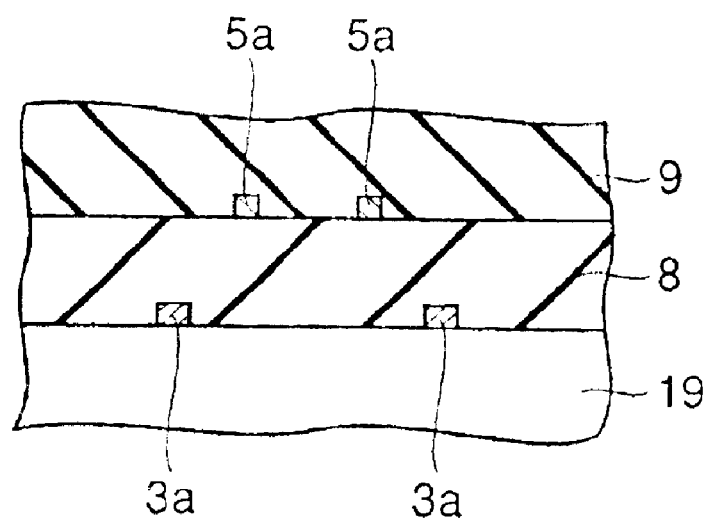
FIG. 13 is a schematic cross section taken along the line XIII—XIII of FIG. 10.

In registration mark 15, the first interconnection pattern ID sign 17 is formed as in the registration mark shown in FIG. 10, and a first contact hole ID sign 40 identifying the step of exposure for forming contact hole 4*b* is formed by the contact hole 4*b*. Further, the in-shot position indication mark 41 is provided by the contact hole formed in the first interlayer insulating film, in the same step as contact hole 4*b*. On the first interlayer insulating film, a second interlayer insulating film 9 is formed.

In this manner, as the in-shot position indication mark 41 as the auxiliary mark is formed, similar effects as attained by the semiconductor device in accordance with the first embodiment can be attained.

(Fourth Embodiment)

Figure 17:
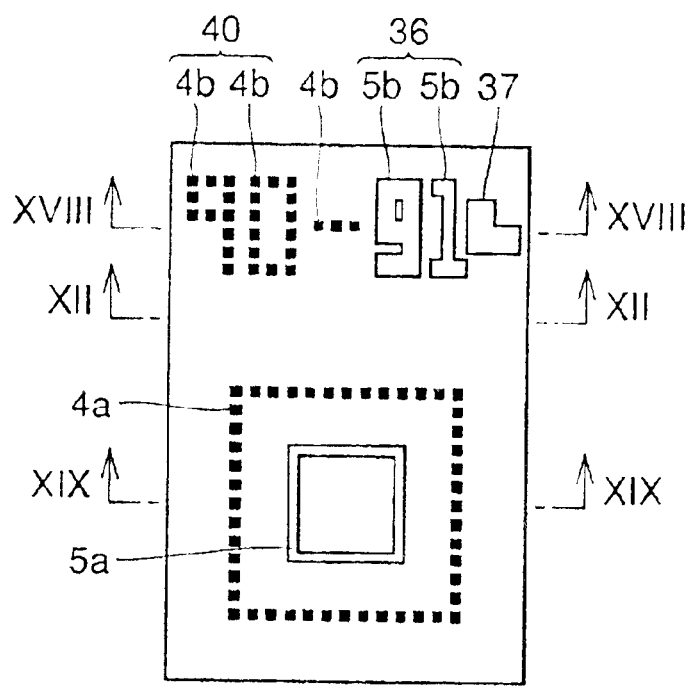
FIG. 17 is a schematic plan view representing a registration mark in accordance with a fourth embodiment of the semiconductor device in accordance with the present invention.
Figure 18:
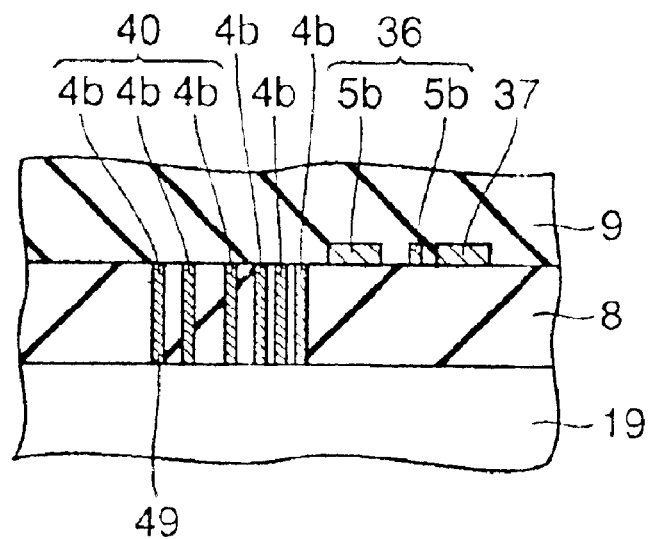
FIG. 18 is a schematic cross section taken along the line XVIII—XVIII of FIG. 17.
Figure 19:
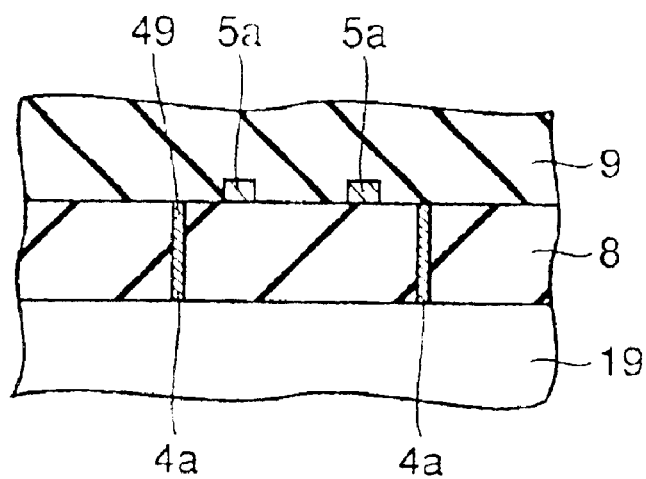
FIG. 19 is a schematic cross section taken along the line XIX—XIX of FIG. 17.

Referring to FIGS. 17 to 19, registration mark 15 is used for measuring registration accuracy between a contact hole formed simultaneously (in the same shot) with the first contact hole 4*b* and the layer including the second interconnection 5*b*. The first inspection pattern 4*a* is formed by the contact hole formed in the same step as the first contact hole 4*b*. Further, a second inspection pattern 5*a* having a rectangular planar shape is formed by the same layer as the second interconnection 5*b*. By measuring the distance in horizontal direction between the first and second inspection patterns 4*a* and 5*a*, the registration accuracy between the contact hole mentioned above and a layer including the second interconnection 5*b* can be measured.

In registration mark 15, a first contact hole ID sign 40 identifying the step of exposure for forming the first contact hole 4*b* is formed by the first contact hole 4*b*. Further, a second interconnection pattern ID sign 36 identifying the step of exposure to form the layer including the second interconnection 5*b* is formed by the second interconnection 5*b*. Further, the in-shot position indication mark 37 is formed by the conductive layer of the same layer as the second interconnection 5*b*. In this manner, as the registration mark 15 includes the in-shot position indication mark 37, similar effects as attained by the first embodiment of the semiconductor device in accordance with the present invention can be attained by the semiconductor device including a registration mark shown in FIGS. 17 to 19.

(Fifth Embodiment)

Figure 20:
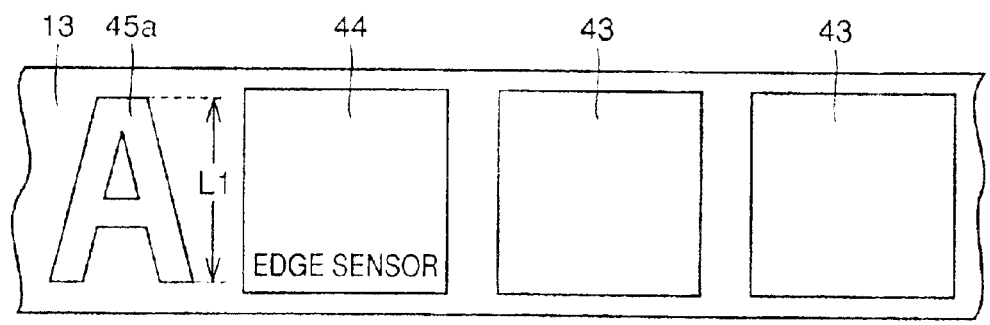
FIG. 20 is a schematic plan view representing a pad group formed in the inspection mark area in accordance with a fifth embodiment of the semiconductor device in accordance with the present invention.
Figure 21:
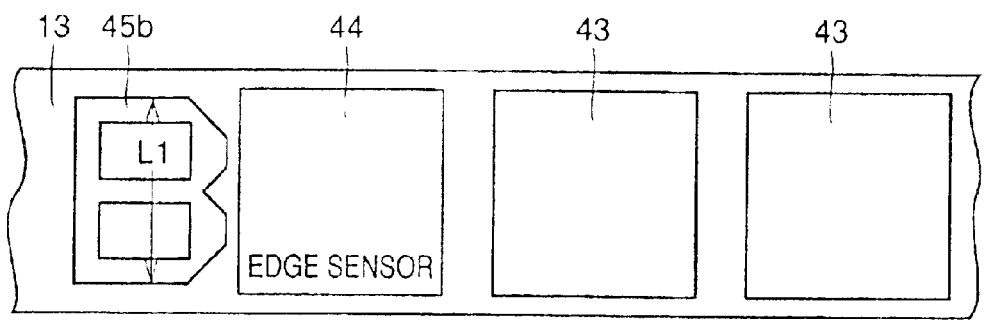
FIG. 21 is a schematic plan view representing a pad group formed in the inspection mark area in the fifth embodiment of the semiconductor device in accordance with the present invention.

An electrode pad 43 shown in FIG. 20 is formed in inspection mark area 34*a* (see FIG. 6), and electrode pad 43 shown in FIG. 21 is formed in inspection mark area 35*a* (see FIG. 6).

Referring to FIG. 20, in order to identify electrode 43 formed in inspection mark area 34*a* (see FIG. 6), an identification character 45*a* as an identification (ID) mark is formed by a conductive film of the same layer as electrode 43. The planar shape of identification character 45*a* may be "A", as shown in FIG. 20, for example. The operator can readily identify a group of pads from pad 44 as edge sensor and the electrode pad 43, by the ID character 45*a*.

The width L1 of ID character 45*a* is set to be at least 30 $\mu$m. By this setting, the width L1 of ID character 45*a* can be made larger than the width of a blade (dicing blade) used for dicing to cut the dicing line area 13. Therefore, in the step of dicing, in which the semiconductor substrate is cut by the dicing blade in dicing line area 13, it is possible to leave part of the ID character 45*a* at an end of the semiconductor chip obtained by cutting the semiconductor substrate. As the part of ID character 45*a* remains, it is possible to use the ID character 45*a* left after the step of dicing, as a reference point to specify the position of defect generation, if a defect or failure such as peeling of a pattern occurs in the step of dicing. As a result, the position of defect where peeling of a pattern or the like occurs can be easily specified.

Further, when the width L1 of ID character 45*a* is made wide, visibility of ID character 45*a* can be improved.

Pad 44 as the edge sensor is formed by the same layer as electrode pad 43, and used for detecting position when the probe is pressed to electrode pad 43, for example.

Referring to FIG. 21, as an ID mark for identifying an electrode pad group including electrode pads 43 and edge sensor 44 formed in inspection mark area 35*a* (see FIG. 6), an ID character 45*b* is formed by the conductive film of the same layer as electrode pad 43. A character such as "B" as shown in FIG. 21 may be used as ID character 45*b*.

In this manner, by forming ID characters 45*a* and 45*b* corresponding to respective electrode pad groups, it is possible for the operator to identify the electrode pad groups. As a result, an accident of taking erroneous data by pressing a probe onto an erroneous electrode pad 43 can be prevented.

Further, by setting the width L1 of ID character 45*b* shown in FIG. 21 to be at least 30 μm, similar effects as attained by ID character 45*a* shown in FIG. 20 can also be attained.

(Sixth Embodiment)

Figure 22:
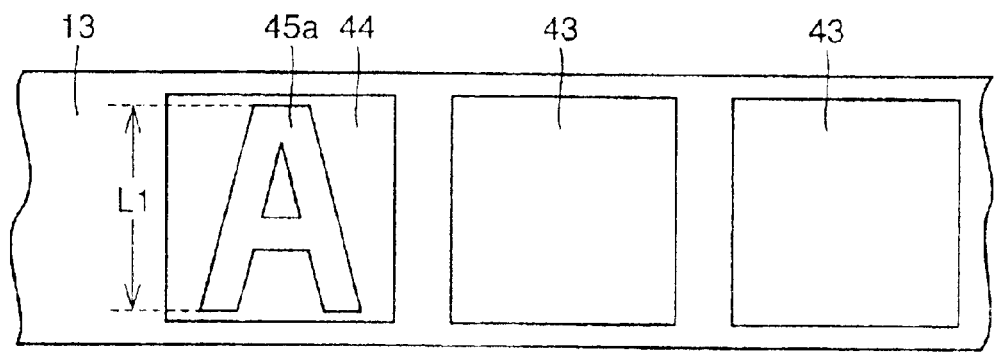
FIG. 22 is a schematic plan view representing a pad group formed in the inspection mark area in accordance with a sixth embodiment of the semiconductor device in accordance with the present invention.
Figure 23:
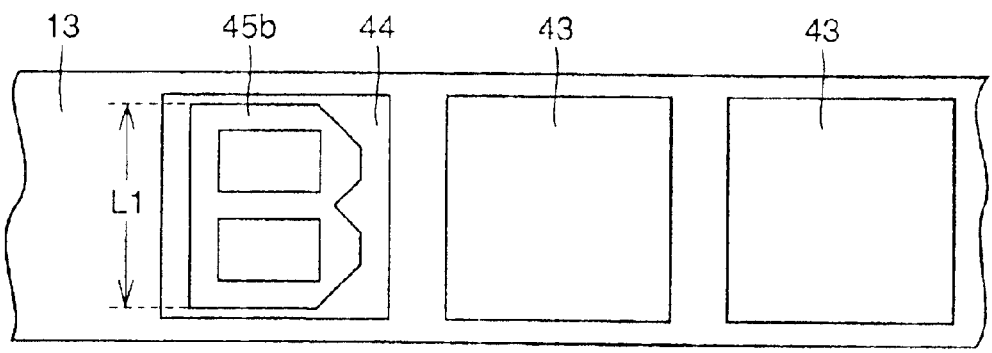
FIG. 23 is a schematic plan view representing a pad group formed in the inspection mark area in accordance with the sixth embodiment of the semiconductor device in accordance with the present invention.

FIG. 22 shows an electrode pad group formed in inspection mark area 34*a* (see FIG. 6), and it corresponds to FIG. 20. FIG. 23 shows an electrode pad group formed in inspection mark area 35*a* (see FIG. 6), and it corresponds to FIG. 21.

Referring to FIGS. 22 and 23, ID characters 45*a* and 45*b* for identifying the electrode pad groups are formed in the electrode pad groups respectively. The ID characters 45*a* and 45*b* are formed on pads 44 as edge sensors, respectively. More specifically, ID characters 45*a* and 45*b* are formed by removing the conductive film constituting the pad 44 at regions to be the ID characters 45*a* and 45*b*, from the surface of the pad 44. Even when provided in this manner, the electrode pad groups can be identified by ID characters 45*a* and 45*b*, and therefore, similar effect as in the fifth embodiment of the semiconductor device of the present invention can be attained.

Further, as the ID characters 45*a* and 45*b* are formed on pads 44, the area required for ID characters 45*a* and 45*b* can be reduced as compared with the examples of FIGS. 20 and 21. As a result, the area of inspection mark areas 34*a* and 35*a* can be reduced.

Similar to ID characters 45*a* and 45*b*, ID characters 45*a* and 45*b* should preferably have the width L1 of at least 30 μm. By such a setting, it is possible to use ID characters 45*a* and 45*b* as reference points for specifying a defective portion, as in the semiconductor device shown in FIGS. 20 and 21, after the step of dicing.

Further, the width of a line constituting ID characters 45*a* and 45*b* is made to be at most 10 μm. By such setting, the width of the line constituting ID characters 45*a* and 45*b* can be made sufficiently smaller than the width of a tip portion of the probe pressed to pad 44. Therefore, when the probe or the like is pressed to pad 44, the problem of insufficient electric connection between the probe and the pad 44 caused by the existence of ID characters 45*a* and 45*b* can be prevented.

In FIGS. 22 and 23, ID characters 45*a* and 45*b* are formed on pads 44 as the edge sensor. ID characters 45*a* and 45*b*, however, may be formed on the electrode pads 43.

(Seventh Embodiment)

Referring to FIGS. 24 to 28, there is an active region 2 surrounded by trench isolation insulating film 1 at the main surface of semiconductor substrate 19 in the semiconductor device. On the active region 2, the first interlayer insulating film 8 is formed. In the first interlayer insulating film 8, there is formed an isolated hole pattern 50 Melvin pattern) in an area positioned above active region 2, and an opening 47 as a position indication mark indicating the position of isolated hole pattern 50, at a position adjacent to the isolated hole pattern 50. The planar shape of opening 47 is an arrow indicating the direction of isolated hole pattern 50. It is preferred that the distance between isolated hole pattern 50 and opening 47 is at least 1 μm and at most 10 μm. A conductive film 49 is filled in isolated hole pattern 50 and opening 47. On the first interlayer insulating film 8, the second interconnection 5 of a prescribed shape is formed on isolated hole pattern 5. Further, at an area positioned above opening 47, a conductive film 48 is formed. The isolated hole pattern may be formed in at least one of inspection mark areas 29*a* to 35*a*, 30*c*, 29*b*, 31*c* and 32*b*.

On the second interconnection 5 and on the conductive film 48, the second interlayer insulating film 9 is formed.

Figure 24:
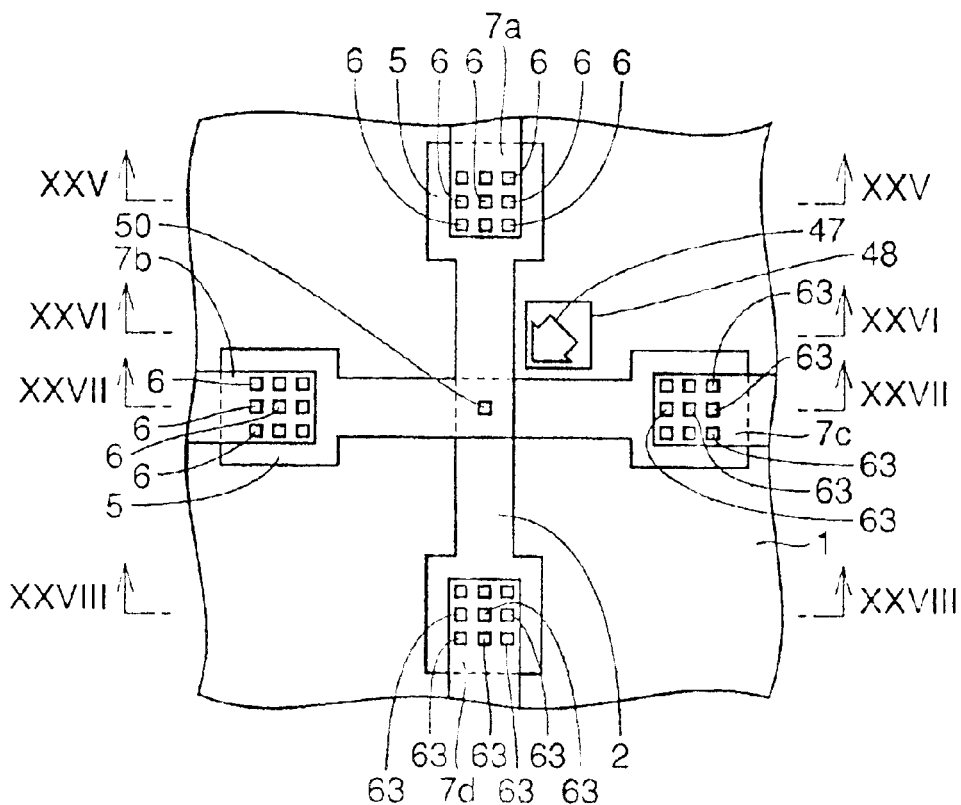
FIG. 24 is a schematic plan view representing an isolated hole pattern formed in the inspection mark area in accordance with a seventh embodiment of the semiconductor device in accordance with the present invention.
Figure 25:
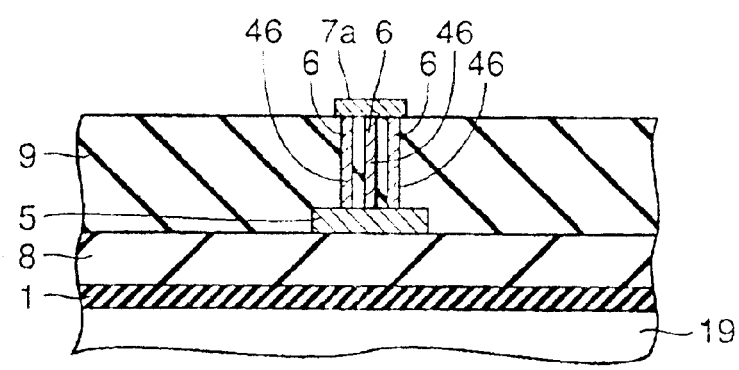
FIG. 25 is a schematic cross section taken along the line XXV—XXV of FIG. 24.
Figure 26:
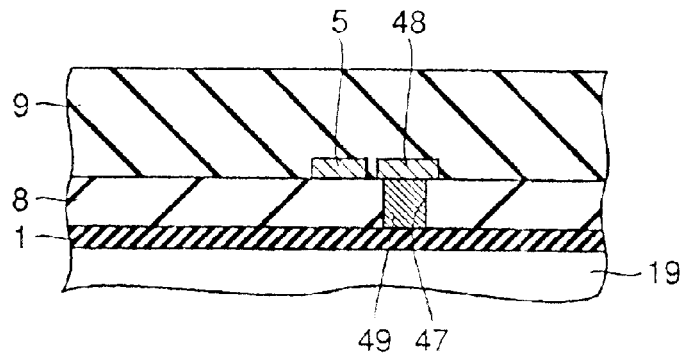
FIG. 26 is a schematic cross section taken along the line XXVI—XXVI of FIG. 24.

Referring to FIGS. 24 and 25, at an area positioned above a prescribed area of the second interconnection 5, a contact hole 6 is formed by partially removing the second interlayer insulating film 9. In contact hole 6, conductor 46 is filled. At an area positioned above contact hole 6, a third interconnection 7*a* is formed. Similarly, referring to FIG. 27, above another area of the second interconnection 5, a contact hole 6 is formed by partially removing the second interlayer insulating film. In contact hole 6, conductor 46 is filled. At an area positioned above contact hole 6, a third interconnection 7*b* is formed.

Figure 27:
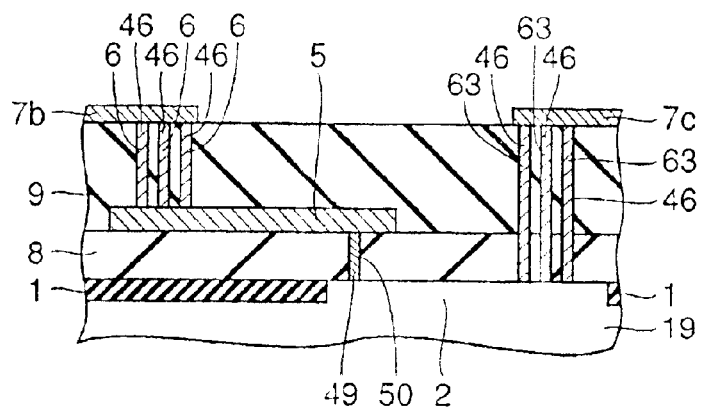
FIG. 27 is a schematic cross section taken along the line XXVII—XXVII of FIG. 24.
Figure 28:
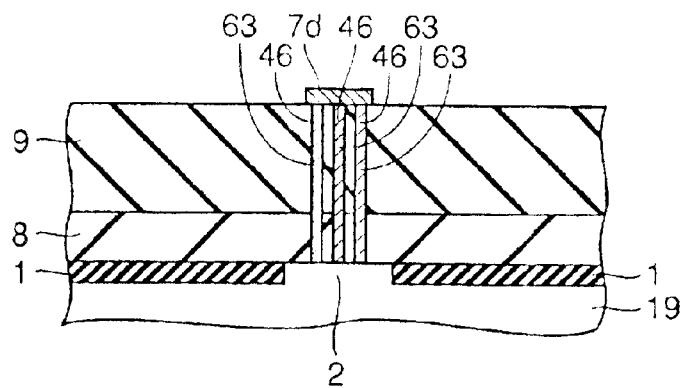
FIG. 28 is a schematic cross section taken along the line XXVIII—XXVIII of FIG. 24.
Figure 29:
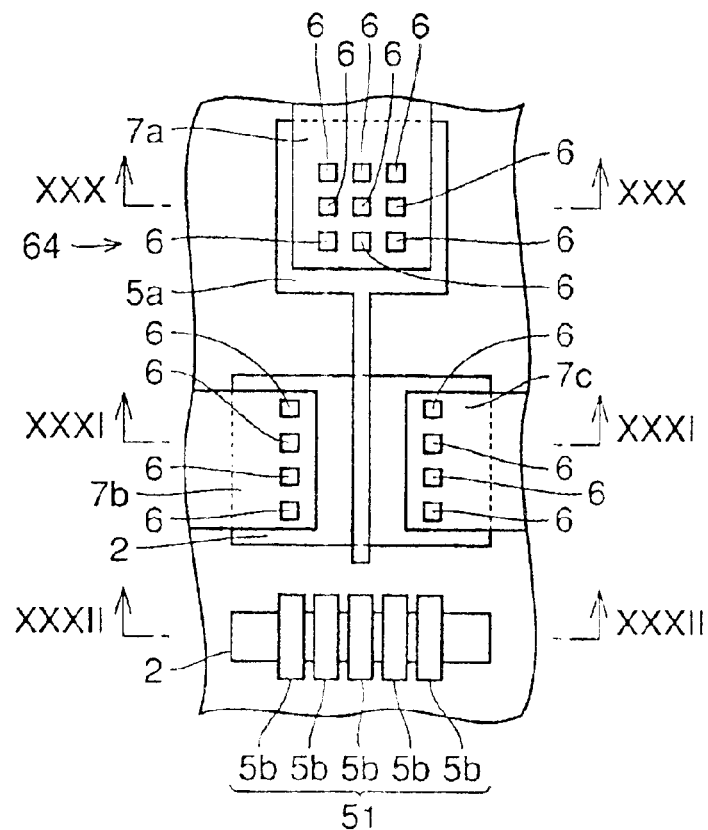
FIG. 29 is a schematic plan view representing a correcting pattern formed in the inspection mark area in accordance with an eighth embodiment of the semiconductor device in accordance with the present invention.
Figure 30:
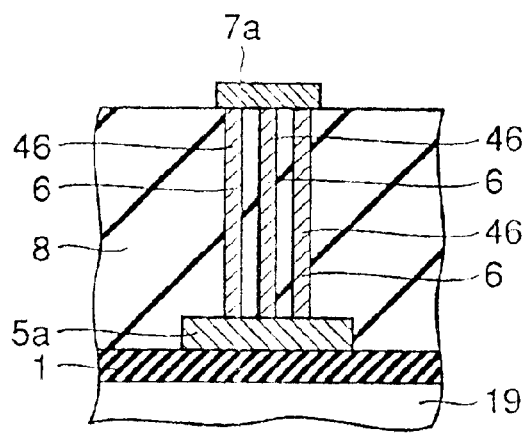
FIG. 30 is a schematic cross section taken along the line XXX—XXX of FIG. 29.
Figure 31:
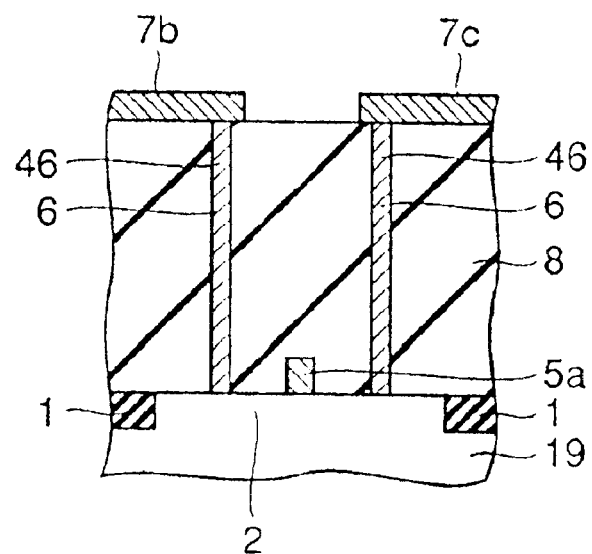
FIG. 31 is a schematic cross section taken along the line XXXI—XXXI of FIG. 29.
Figure 32:
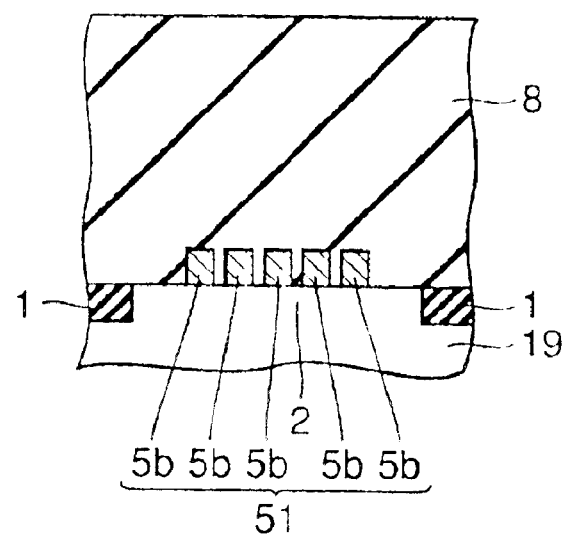
FIG. 32 is a schematic cross section taken along the line XXXII—XXXII of FIG. 29.
Figure 33:
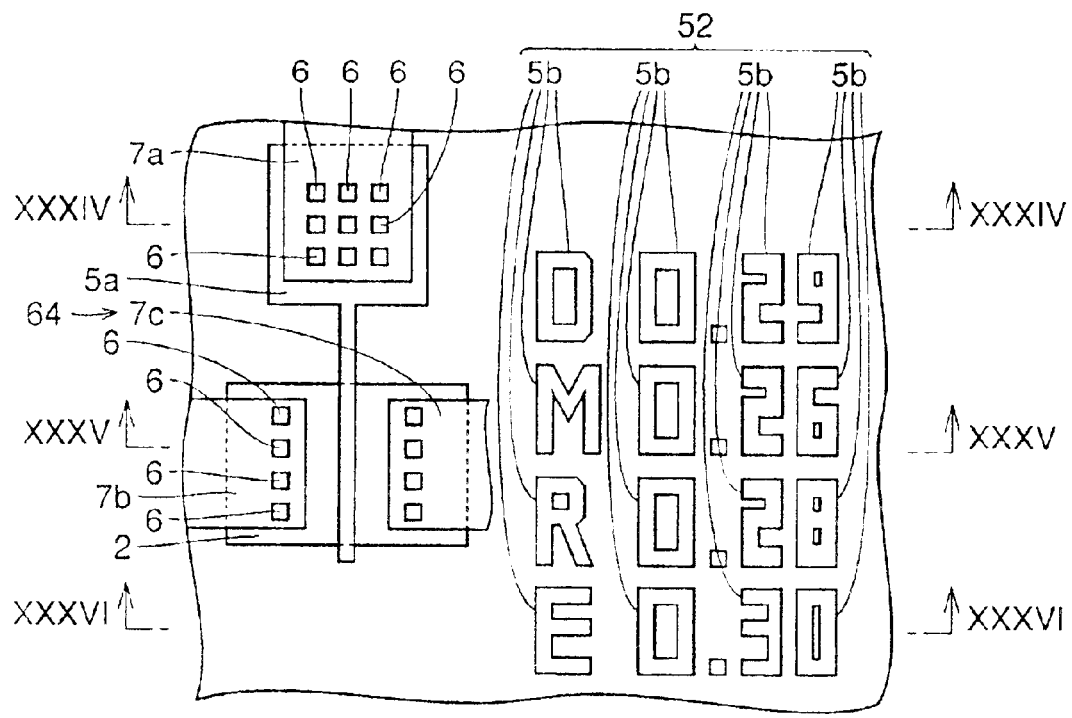
FIG. 33 is a schematic plan view of a process condition indicating portion 52 as a condition indication mark and a testing element formed in the inspection mark area in accordance with a ninth embodiment of the semiconductor device in accordance with the present invention.
Figure 34:
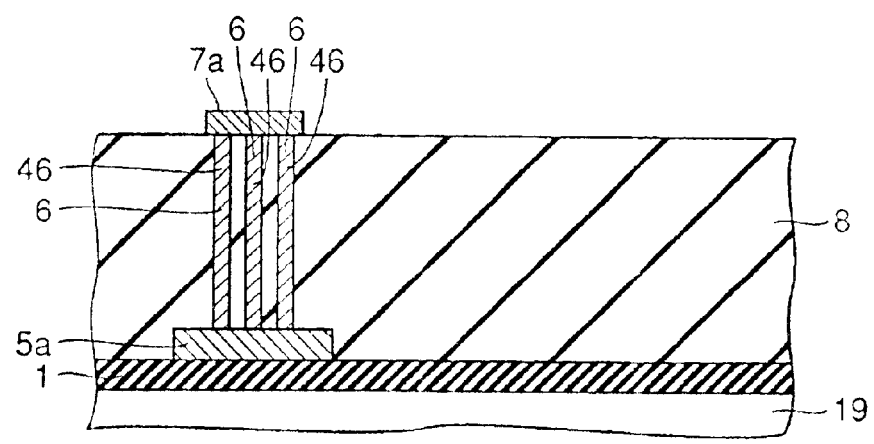
FIG. 34 is a schematic cross section taken along the line XXXIV—XXXIV of FIG. 33.
Figure 35:
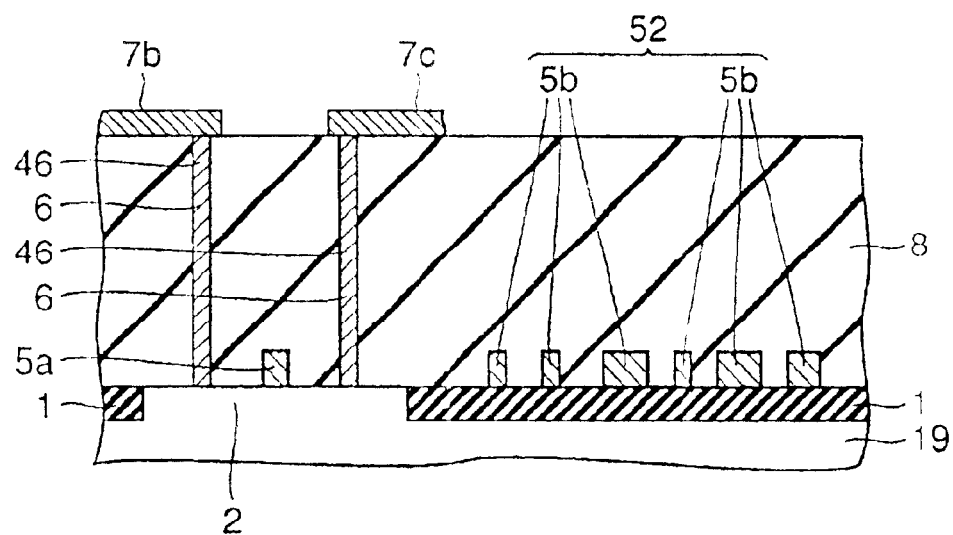
FIG. 35 is a schematic cross section taken along the line XXXV—XXXV of FIG. 33.
Figure 36:
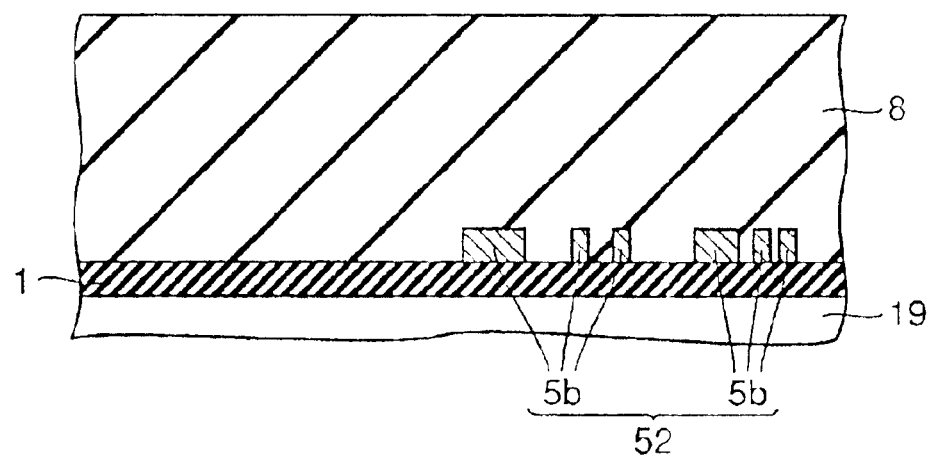
FIG. 36 is a schematic cross section taken along the line XXXVI—XXXVI of FIG. 33.
Figure 37:
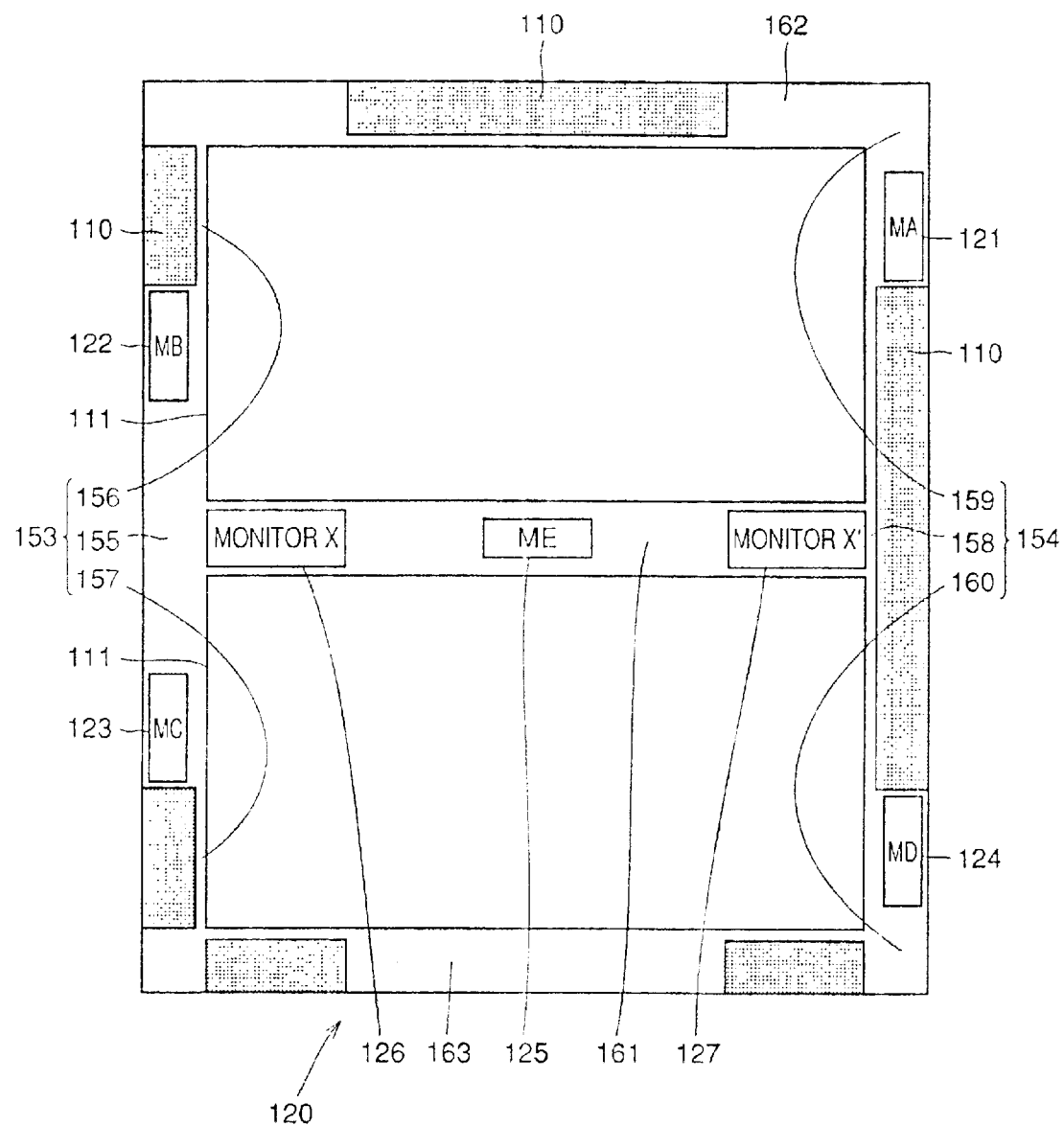
FIG. 37 is a schematic plan view showing a conventional photomask.
Figure 38:
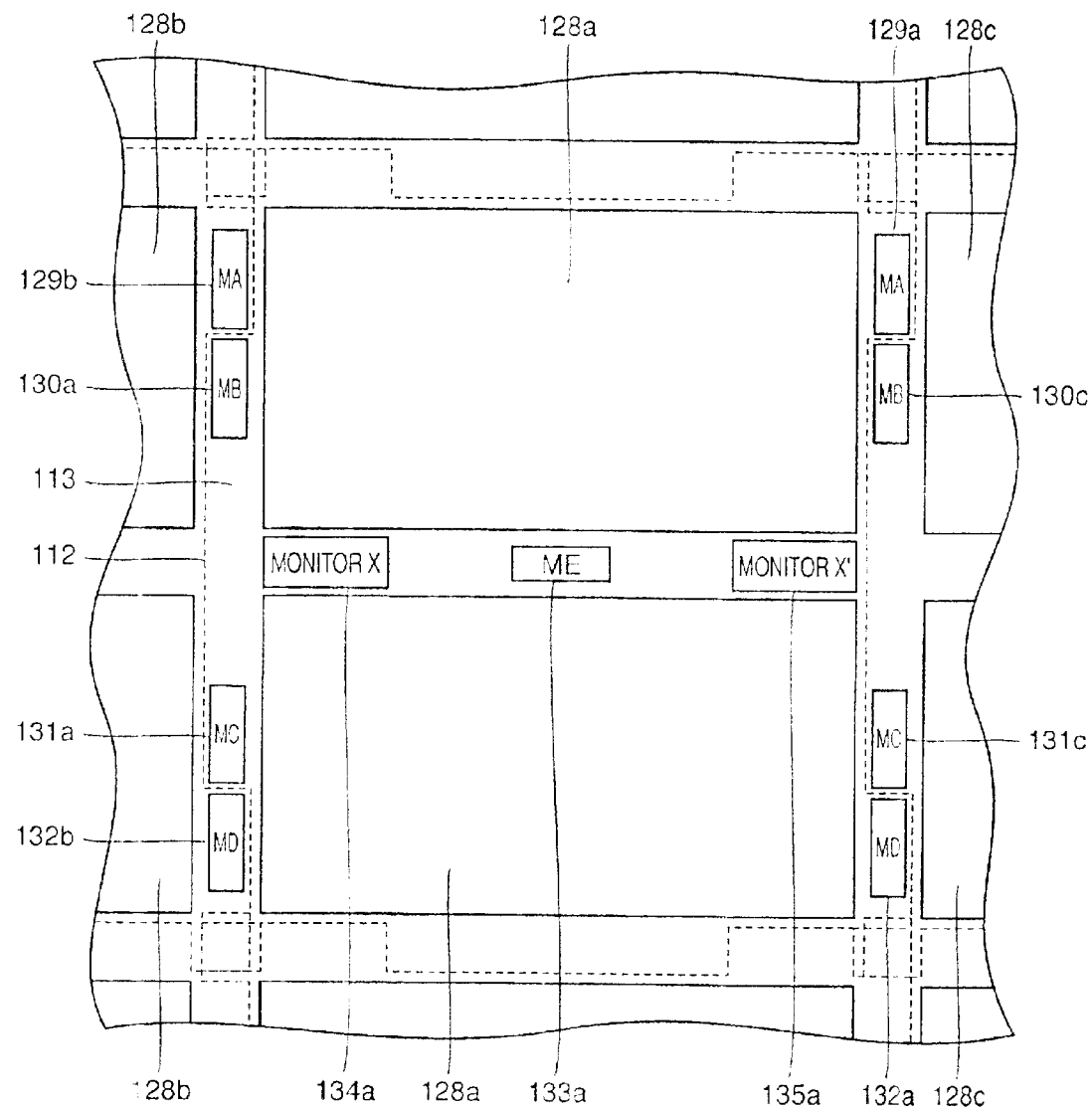
FIG. 38 is a schematic diagram representing a structure obtained by transferring a transfer pattern to a main surface of a semiconductor substrate, using the photomask shown in FIG. 37.
Figure 39:
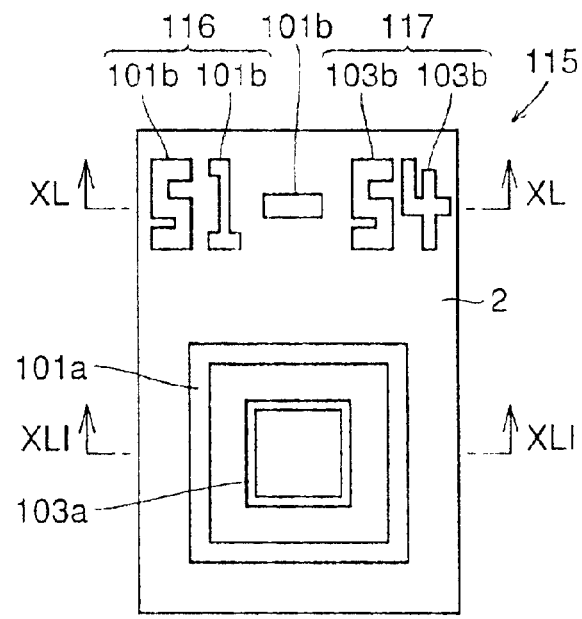
FIG. 39 is a schematic plan view representing a conventional registration mark.
Figure 40:
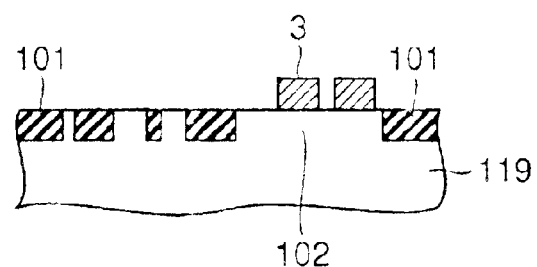
FIG. 40 is a schematic cross section taken along the line XL—XL of FIG. 39.
Figure 41:
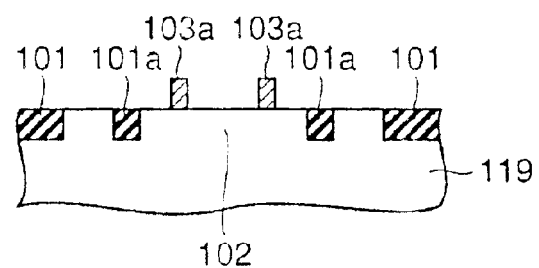
FIG. 41 is a schematic cross section taken along the line XLI—XLI of FIG. 39.
Figure 42:
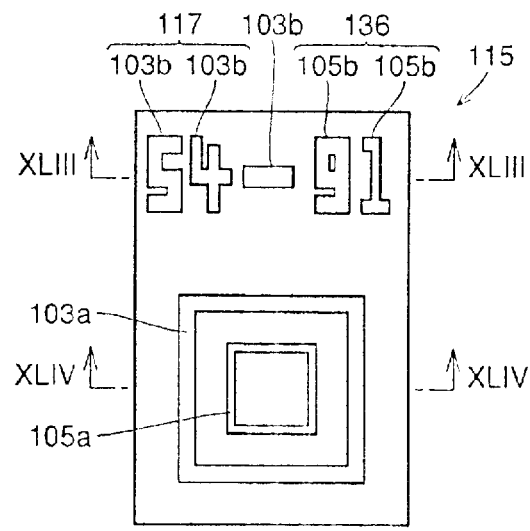
FIG. 42 is a schematic plan view showing another example of the conventional registration mark.
Figure 43:
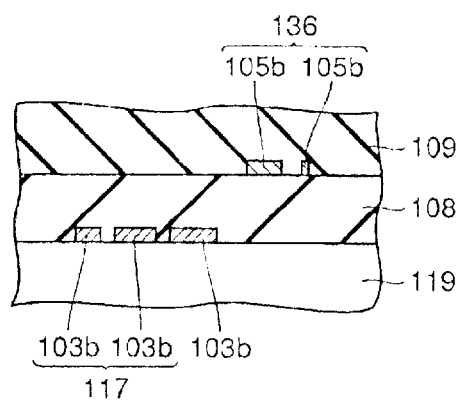
FIG. 43 is a schematic cross section taken along the line XLIII—XLIII of FIG. 42.
Figure 44:
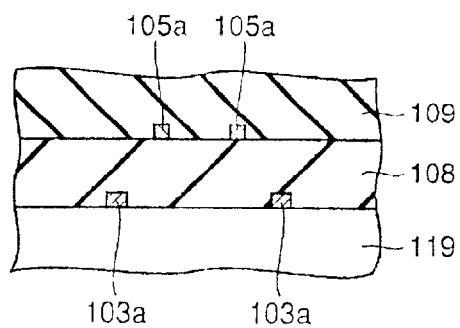
FIG. 44 is a schematic cross section taken along the line XLIV—XLIV of FIG. 42.
Figure 45:
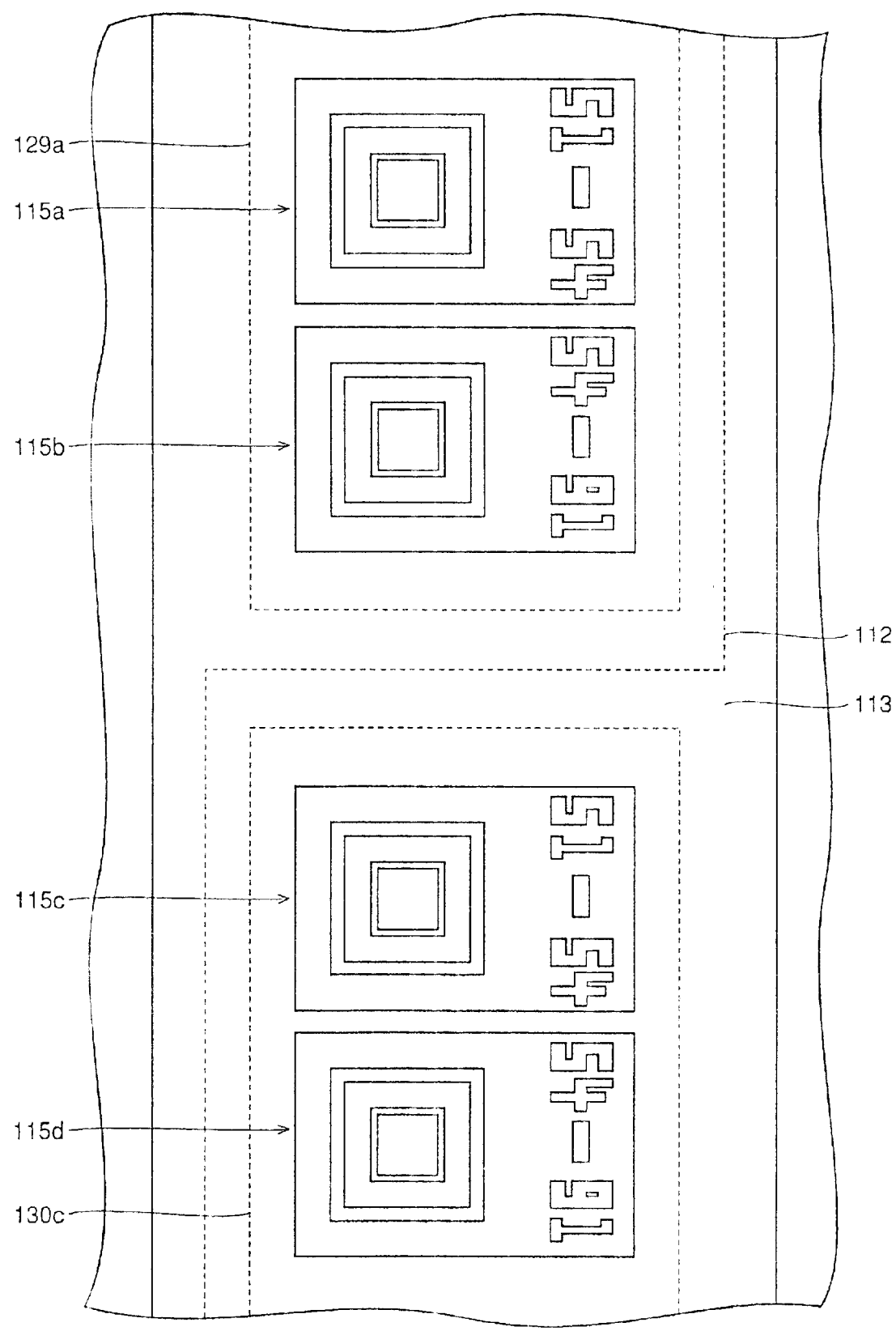
FIG. 45 is a schematic plan view of registration marks 115a–115c formed in the inspection mark areas 129a and 130c of FIG. 38.
Figure 46:
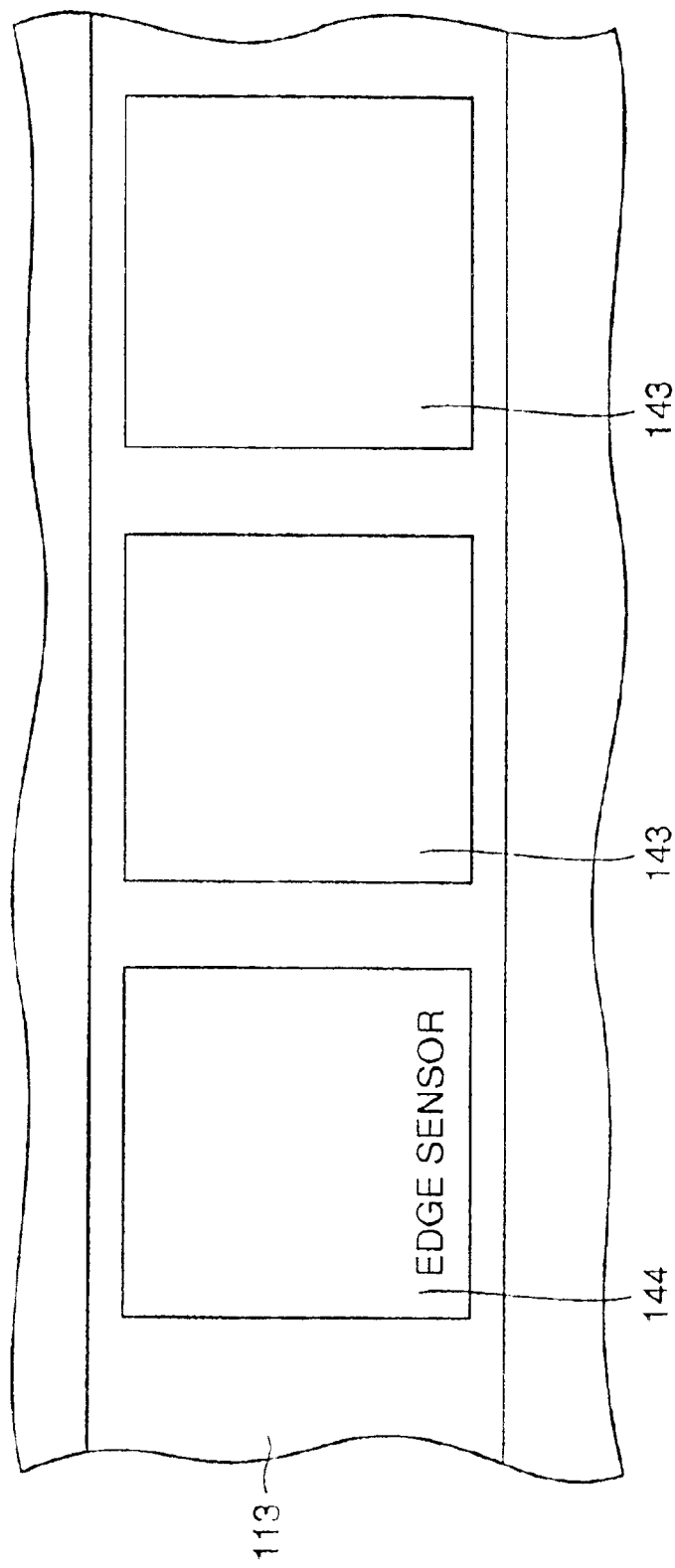
FIG. 46 is a schematic plan view of a pad group formed in the inspection mark areas 134a and 135b of FIG. 38.
Figure 47:
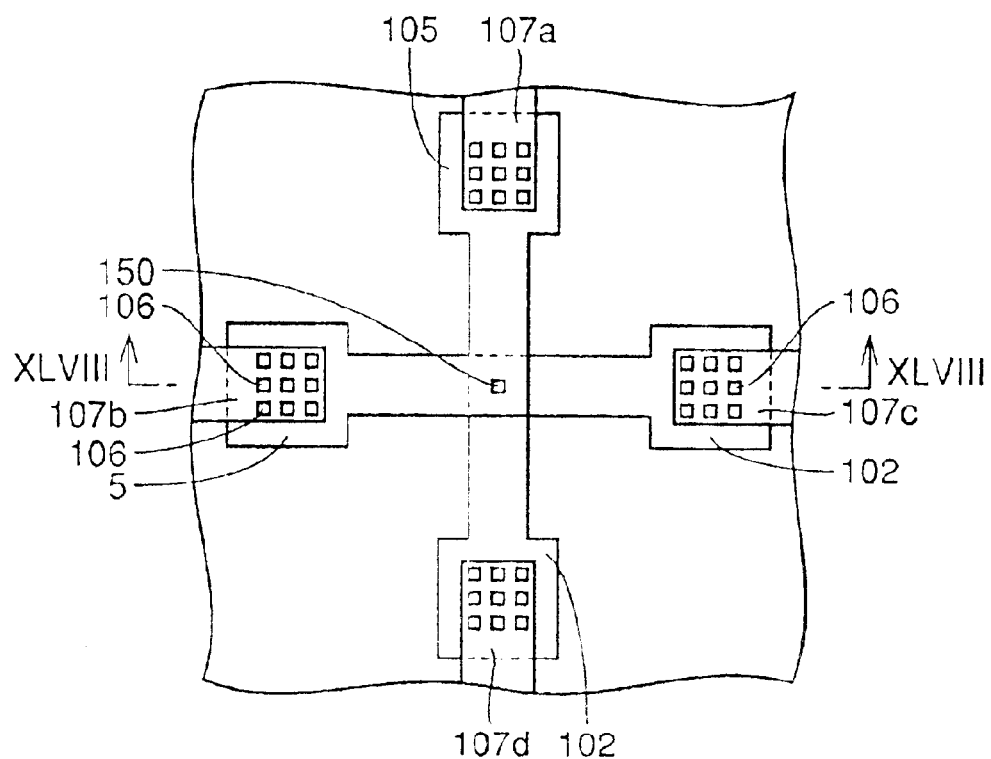
FIG. 47 is a schematic plan view representing an isolated hole pattern formed in the inspection mark area of a conventional semiconductor device.
Figure 48:
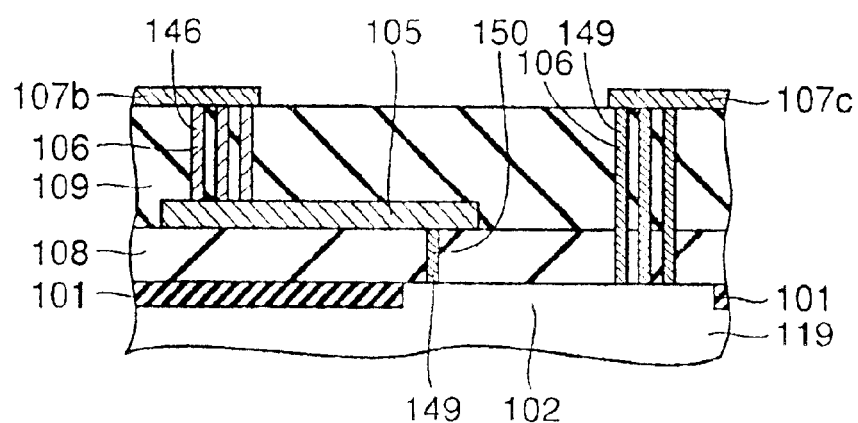
FIG. 48 is a schematic cross section taken along the line XLVIII—XLVIII of FIG. 47.
Figure 49:
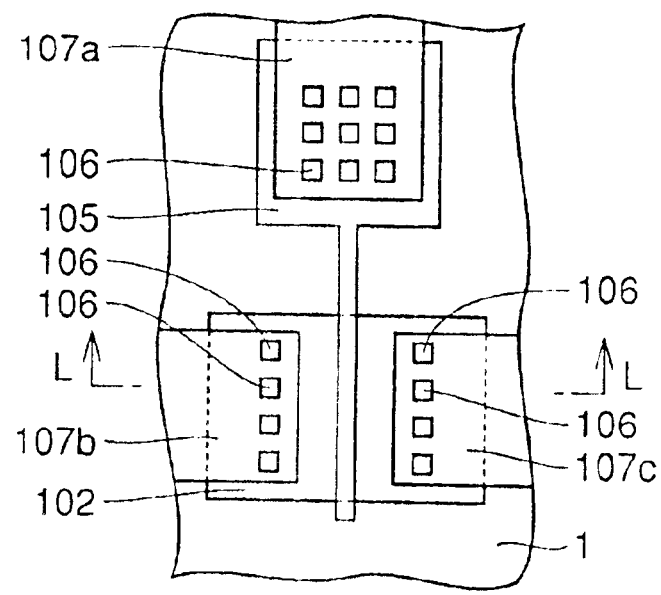
FIG. 49 is a schematic plan view representing a testing element formed in the inspection mark area of a conventional semiconductor device.
Figure 50:
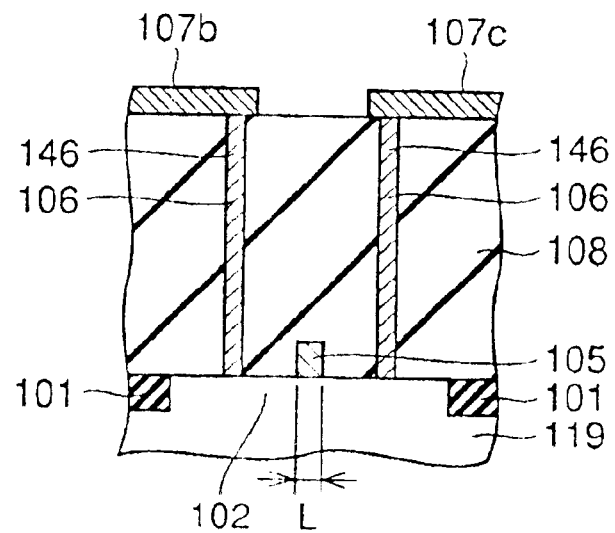
FIG. 50 is a schematic cross section taken along the line L—L of FIG. 49.

Referring to FIGS. 27 and 28, at a position above active region 2, a contact hole 63 is formed by partially removing the first and second interlayer insulating films 8 and 9. In contact hole 63, a conductive film 46 is filled. Third interconnections 7*c* and 7*d* are formed on contact hole 63.

In this manner, as opening 47 serving as a position indication mark is formed near the isolated hole pattern 50, it is possible for the user to easily find the isolated hole pattern 50. Especially when the length of the isolated hole pattern 50 is to be measured using a scanning electron microscope in-line, it has been sometimes very difficult to find the isolated hole pattern 50 because of charge up of the resist film. Formation of the position indication mark in accordance with the present invention is effective in such a case.

In the step of forming isolated hole pattern 50 as the contact hole, opening 47 as the position indication mark can be formed simultaneously. Therefore, increase in the number of process steps for manufacturing the semiconductor device is not increased to form opening 47.

Further, as the planar shape of opening 47 is an arrow indicating the direction of isolated hole pattern 50, the operator can easily confirm the position of isolated hole pattern 50, by identifying the planar shape of opening 47.

(Eighth Embodiment)

Referring to FIGS. 29 to 32, in inspection mark areas 29*a* to 35*a*, 30*c*, 29*b*, 31*c* and 32*b*, a testing element 64 and a correcting pattern 51 as a pitch correcting mark are formed. It is preferred that the distance between testing element 64 and correcting pattern 51 is at most 50 μm. Testing element 64 includes, at the main surface of semiconductor substrate 19, an active region 2 surrounded by trench isolation insulating film 1 and a second interconnection 5*a* serving as a gate electrode. The active region 2 serves as source and drain regions. The first interlayer insulating film 8 is formed on the second interconnection 5*a*. In the first interlayer insulating film 8, contact holes 6 (see FIG. 31) are formed by partially removing the first interlayer insulating film 8 at the areas positioned above active region 2 and second interconnection 5*a*. Conductive film 46 is filled in contact hole 6. At areas positioned on contact holes 6, third interconnections 7*a* to 7*c* are formed, respectively. The correcting pattern shown in FIG. 29 may be formed in at least one of inspection mark areas 29*a* to 35*a*, 30*c*, 29*b*, 31*c* and 32*b*.

As correcting pattern 51, a plurality of line patterns (line and space patterns) are formed by the second interconnection 5*b* arranged parallel to each other and spaced by a prescribed distance from each other. In correcting pattern 51, the line width of the second interconnection 5*b* is formed in accordance with the design rule in the photolithography step. This enables formation of the correcting pattern 51 with precise line width. Therefore, when the width (gate length) of 5*a* (see FIG. 31) serving as the gate electrode is to be measured, it is possible to quickly and easily perform the operation of data calibration, using the correcting pattern 51. As a result, accuracy in measurement of the gate length can be improved.

(Ninth Embodiment)

Referring to FIGS. 33 to 36, a semiconductor device will be described. A process condition indicating portion 52 shown in FIG. 33 may be formed in at least one of inspection mark areas 29*a* to 35*a*, 30*c*, 29*b*, 31*c* and 32*b*.

Referring to FIGS. 33 to 36, testing element 64 formed in the inspection mark area of a semiconductor device basically has a similar structure as the testing element shown in FIGS. 29 to 32. In the vicinity of the testing element 64, a process condition indicating portion 52 formed by using the second interconnection 5*b* of the same layer as the second interconnection 5*a* is arranged. It is preferred that the distance between testing element 64 and process condition indicating portion 52 is at most 50 μm.

In the process condition indicating portion 52, four datas, that is, design dimension, on-mask dimension, resist target dimension and finished target dimension are indicated. More specifically, referring to FIG. 33, D0.29 represents that the design dimension is 0.29 μm. M0.26 represents that the on-mask dimension is 0.26 μm. Further, R0.28 represents that the resist target dimension is 0.28 μm. Further, E0.30 represents that the finished (end) target dimension is 0.30 μm.

As the process condition indicating portions 52 representing the process conditions are formed in the inspection mark area, the operator can readily know the process conditions. This enables immediate discovery of defects associated with the step of exposure. For example, as the design dimension and the on-mask dimension are indicated, whether the sizing is correct or not can be immediately determined. Further, as the on-mask dimension and the resist target dimension are indicated simultaneously, failure in the step of photolithography can be easily detected. When the resist target dimension and the finished target dimension are indicated, a failure in the etching process can readily and immediately be detected.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising a device forming area formed on a semiconductor substrate and a dicing line area arranged surrounding the device forming area, wherein said dicing line area comprises first and second registration marks formed in different shots in respective registration mark areas, a boundary line separates said respective registration mark areas, said boundary line defining a protruded portion and a recessed portion, respectively, at opposite directions on either side of the boundary line in a plane parallel to the substrate, the protruded portion containing at least one of the registration marks, and said first and second registration marks each include an auxiliary mark to identify the first and second registration marks.

2. The semiconductor device according to claim 1, wherein a surface of the semiconductor substrate is divided into a plurality of areas for performing photolithography process on each of the areas, each said area including either said first or second registration mark at an outermost peripheral portion, wherein said auxiliary mark is an in-area position indication mark indicating relative position of respective ones of said first and second registration marks in said area.

3. The semiconductor device according to claim 2, wherein said first or second registration mark is formed in at least one of four corners of said area.

4. The semiconductor device according to claim 1, wherein said auxiliary mark has an arrow-like planar shape.

* * * * *